(12) United States Patent
Grebenkemper

(10) Patent No.: US 6,870,436 B2
(45) Date of Patent: Mar. 22, 2005

(54) METHOD AND APPARATUS TO ATTENUATE POWER PLANE NOISE ON A PRINTED CIRCUIT BOARD USING HIGH ESR CAPACITORS

(75) Inventor: John Grebenkemper, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 167 days.

(21) Appl. No.: 10/097,215

(22) Filed: Mar. 11, 2002

(65) Prior Publication Data

US 2003/0169121 A1 Sep. 11, 2003

(51) Int. Cl.[7] ................................................ H04B 3/28
(52) U.S. Cl. ........................ 333/12; 333/181; 702/57; 703/13; 716/1
(58) Field of Search .................... 333/12, 247, 181, 333/236; 324/76.11; 702/57; 703/13, 14; 716/1

(56) References Cited

U.S. PATENT DOCUMENTS

| | | | | |
|---|---|---|---|---|
| 5,889,445 A | * | 3/1999 | Ritter et al. ................. 333/172 |
| 5,898,576 A | * | 4/1999 | Lockwood et al. ......... 361/782 |
| 6,104,258 A | * | 8/2000 | Novak ....................... 333/22 R |
| 6,195,613 B1 | * | 2/2001 | Roy et al. ...................... 702/65 |
| 6,385,565 B1 | * | 5/2002 | Anderson et al. ............. 703/18 |
| 6,418,031 B1 | * | 7/2002 | Archambeault ............. 361/762 |
| 6,532,439 B2 | * | 3/2003 | Anderson et al. ............. 703/14 |
| 6,564,355 B1 | * | 5/2003 | Smith et al. .................... 716/4 |
| 6,571,184 B2 | * | 5/2003 | Anderson et al. ............. 702/65 |

* cited by examiner

Primary Examiner—Robert Pascal
Assistant Examiner—Kimberly E Glenn

(57) ABSTRACT

In a method of the present invention, performance characteristics of a printed circuit board are analyzed. The printed circuit board, bypass components and an applied stimulus are modeled. Each of the bypass components includes a capacitor and a resistor in series with each other. Alternatively, a second capacitor is coupled in parallel to the above capacitor and resistor. A simulation of the circuit model is then performed. In this embodiment of the invention, the simulation is responsive to the stimulus as is performed over a range of bypass resistor values. In another embodiment of the invention, a printed circuit board is described with components and characteristics that reduce noise. Such a printed circuit board includes a power plane and a plurality of bypass components. Moreover, the plurality of bypass components include bypass capacitors and bypass resistors coupled in series between the positive power plane and the negative power plane.

106 Claims, 15 Drawing Sheets

METHOD AND APPARATUS TO ATTENUATE POWER PLANE NOISE ON A PRINTED CIRCUIT BOARD USING HIGH ESR CAPACITORS

FIELD OF THE INVENTION

The present invention relates to the field of electronic circuits. More particularly, the present invention relates to printed circuit boards and methods for reducing power plane noise on such printed circuit boards.

BACKGROUND OF THE INVENTION

A wide variety of electrical components have become part of everyday life. In a typical day, a person may use an alarm clock, a computer, a television, and countless other electrically powered tools and appliances. The electric current used to operate each of these components produces both electric fields and magnetic fields, collectively referred to herein as electromagnetic (EM) fields.

As current passes through a conductor, the conductor acts like an antenna to transmit EM fields into the surrounding environment, much like a radio transmission antenna. Conversely, when a conductor is placed in an EM field, current is generated in the conductor, much like a radio reception antenna. So, the EM fields emitted by one electric component can induce electric current, or electromagnetic interference (EMI), in another electric component. Also, depending on the frequency of the emissions, EMI is sometimes also referred to as radio frequency interference (RFI). If the amplitude of the EMI is high enough, it may disrupt normal operations of circuitry. In order to ensure that electrical components can operate in close proximity to one another, various governing bodies, such as the Federal Communications Commission (FCC) in the United States, impose restrictions on EMI or RFI.

Printed circuit boards (PCBs), to which integrated circuits are coupled, can generate relatively large amplitude EMI. For instance, a power plane and a ground plane in a PCB act like antennas. For each clock cycle of an integrated circuit, numerous transistors may simultaneously draw current off the power plane or drive current onto the ground plane. These simultaneous current fluctuations from the power plane or onto the ground plane can cumulatively create large amplitude EMI emissions.

Noise on the power and ground planes also couples into the integrated circuits attached to the PCB. If this noise is too large, it may cause an error in the integrated circuit which will result in improper operation of an electronic device. These types of errors can be intermittent and, therefore, very difficult to determine their cause. These types of intermittent failures happen much more than users or even designers realize. Since they are very difficult to detect, it is better engineering design practice to minimize the power/ground plane noise that can cause them.

As transistor densities increase for integrated circuits, the EMI and noise restrictions become increasingly difficult to meet. Various cost-added techniques, such as noise filtering, can reduce or attenuate EMI and noise from PCBs. Large copper planes, however, and ground planes in particular, are very difficult to filter effectively, making power and ground planes large contributors to EMI and noise. Therefore, a need exists for reducing or attenuating EMI emissions and noise from power and ground planes. There is also a need to improve the performance of power and ground planes without significantly increasing the cost of printed circuit boards. These and related problems are addressed by the present invention.

SUMMARY OF THE INVENTION

The foregoing issues are addressed by the present invention, in part, by increasing the series resistance of bypass components on a printed circuit board in order to reduce unwanted voltage noise or electromagnetic interference (EMI). The bypass components include bypass capacitors and bypass resistors in series with each other. In an embodiment of the invention, a method is disclosed for analyzing the performance characteristics of a printed circuit board. In this method of the invention, the printed circuit board, a plurality of bypass components and an applied stimulus are modeled. Moreover, the bypass components and the stimulus are modeled as being coupled to the printed circuit board. A simulation of the circuit model is then performed using the models of the printed circuit board, the bypass components, and the stimulus. In this embodiment of the invention, the simulation is responsive to the stimulus and is performed over a range of bypass resistor values to determine a resistance value that reduces noise in the simulation.

In another embodiment of the invention, the simulation is performed over a range of bypass capacitor values and over a range of frequency values. In yet another embodiment of the invention, the model of the printed circuit board includes a model of a power plane. Moreover, the power plane is represented as a plurality of transmission lines arranged in a mesh. In an embodiment of the invention, resistor and capacitor values are chosen that minimize or reduce noise on the printed circuit board.

In another embodiment of the invention, a printed circuit board is described with components and characteristics that reduce noise. Such a printed circuit board includes a power plane and a plurality of bypass components. The plurality of bypass components include bypass capacitors and bypass resistors coupled in series to the power plane. In this embodiment, each bypass resistor is selected to reduce noise responsive to a stimulus on the printed circuit board. In another embodiment, the power plane can include at least one positive power plane and at least one negative power plane. In yet another embodiment, integrated circuits and/or discrete components are coupled to the power and ground plane. In other embodiments, high series resistance is achieved by a resistor in series with a capacitor, a capacitor made out of a high resistance conductor, and a capacitor made with a lossy dielectric. Many variations are possible as will be appreciated upon an understanding of the present disclosure.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Designing high-speed digital systems to meet noise, electromagnetic interference (EMI), radio frequency interference (RFI), and Federal Communications Commission (FCC) requirements is a challenge that starts with the layout of a printed circuit board (PCB), also called a printed wiring board (PWB). To avoid multiple design iterations and costly end-product noise or EMI "fixes," the printed circuit board design process has to generate boards that meet both signal integrity and radiated emissions criteria.

Today's higher clock frequencies and faster rise times often cause traces on PCBs to act like antennas thereby increasing undesirable EMI and RFI emissions. High speed (e.g., pico-second) edge times also result in high-speed performance problems such as cross talk, ringing, overshoot, undershoot, and ground bounce.

Thus, it has been observed that sound design techniques at the PCB level according to the present invention results in improved signal integrity (e.g., reduced power distribution noise). Moreover, the ability to analyze digital signals and emissions in both the time and frequency domains, according to the present invention, can provide the basis for optimizing PCB designs for EMI, RFI, and signal integrity.

Figure 1:
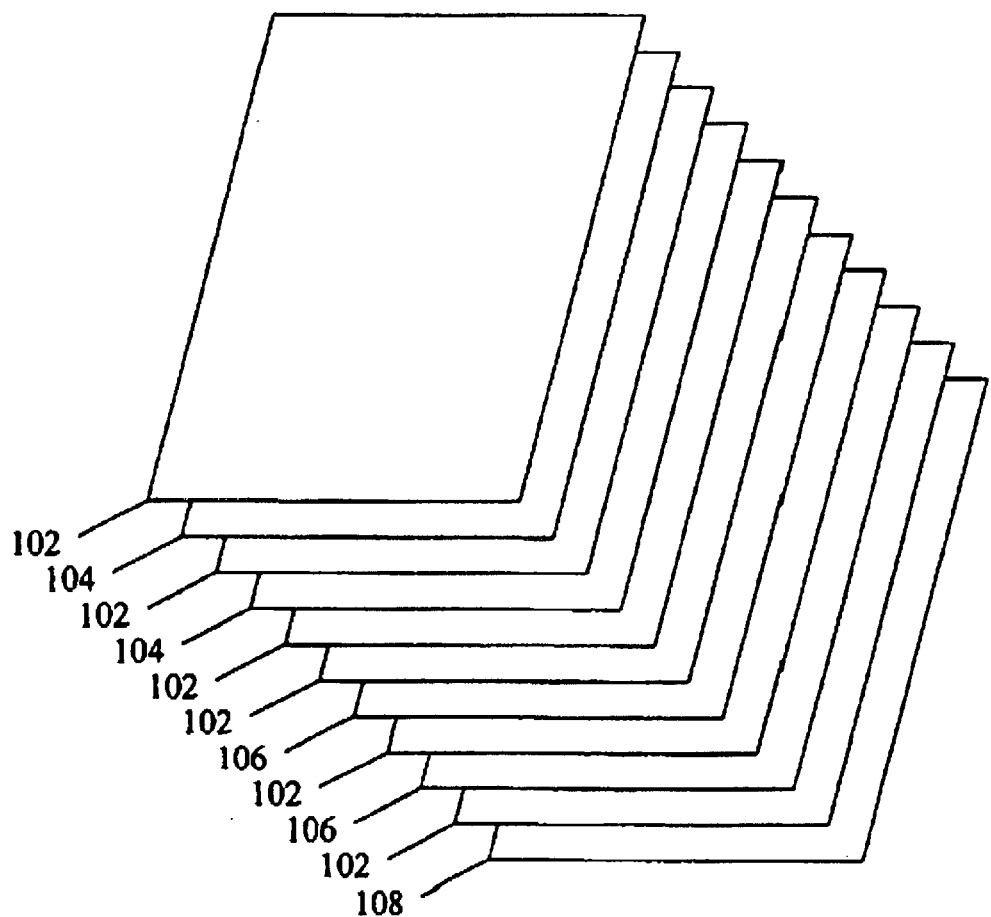
FIG. 1 is a block diagram representation of a commonly employed configuration of the layers of a printed circuit board.

The present invention can be better understood by understanding a few key aspects of printed circuit boards as will be described with reference to FIG. 1. At the time of forming a conductive layer 104 for an electrical conductor, an insulating layer 102 (made of a ceramic such as alumina or other dielectric material such as FR-4) and the conductive layer 104 (made of a metal with a high melting point such as copper (Cu) or tungsten (W)) are alternately laminated together to form the substrate for the printed circuit board. FR-4 is a glass epoxy resin commonly used in making printed circuit boards. One of the conductive layers 104 can then be used as a power plane and another of the conductive layers 104 can be used as a ground plane. The term "ground plane" will be used in the present disclosure, although this term is sometimes also referred to as a "negative power plane." Insulating layers 102 can further be included to separate conductive signal layers 106 or I/O pad layers 108. By repeating any of these layers, a multi-layer printed circuit board 100 is constructed. Most printed circuit boards used in high-speed digital circuits are made with a copper plane carrying a supply voltage, another copper plane carrying ground, and one or more signal layers. With regard to power distribution noise, it is advantageous to place the power and ground planes next to each other without intervening layers. Such a printed circuit board is then appropriate for mounting upon it various semiconductor integrated circuits as well as discrete components.

As electric signals carried on printed circuit boards have increased in operating frequency, printed circuit boards have moved to an insulating layer 102 that is made of a polyimide resin or an epoxy resin (e.g., FR-4). Either of these resins has a comparatively small dielectric constant of between 3.5 and 5. Contrastingly, previously used alumina ceramics have much higher dielectric constants on the order of about 10. On modern printed circuit boards, conductive layer 104 is made of copper or tungsten using a thin-film forming technique. The thin-film technique is typically a vapor phase deposition method such as evaporation and sputtering. Moreover, minute wiring patterns are formed on signal layers 106 and I/O pad layers 108 using photolithography methods. Alumina and ceramics used in printed circuit boards are also used in integrated circuits. Accordingly, the teachings of the present invention are also applicable for use within integrated circuit packages to reduce noise or EMI within such integrated circuits.

Printed circuit boards such as printed circuit board 100 can range in size from less than one square inch to several square feet. Especially with large printed circuit boards and with printed circuit boards carrying, or having in close proximity, very sensitive circuitry, electromagnetic interference is of great concern. The present invention provides for methods to analyze and attenuate high frequency noise generated on PCB power/ground planes. This noise is becoming a significant problem in the design of high-speed computer systems, which can cause increased transient failures. Thus, the present invention proposes methods and printed circuit boards that are directed to reducing unwanted EMI noise.

A conventional PCB consists of multiple copper power planes, ground planes, and signal planes as described with reference to FIG. 1. Signals can be routed between the power and ground planes through vertically deposited conductive material to form what are called vias. To improve the noise attenuation, the power and ground planes are often placed next to each other to form a power-ground plane pair. This allows the capacitance between these planes to create more effective high-frequency attenuation. On large PCBs using an FR-4 dielectric, the first resonant frequency on the power-ground plane will be in the range of 100 MHz to 300 MHz. With higher dielectric constant material, the first resonant frequency will be lower. Above the first resonance, there will be many additional resonances, each of which can create excess noise on the power-ground planes.

Bypass capacitors, also called decoupling capacitors, are often connected between each power plane and the ground plane to attenuate noise. Low frequency bypass capacitors have values of ten's to thousand's of microfarads, and suppress low frequency noise. High frequency bypass capacitors have smaller values and suppress high frequency noise such as the undesired EMI that is of concern here. Bypass capacitors that are used to provide high frequency noise compensation, provide a momentary charge when active devices change their current consumption. The charge in the bypass capacitors is replenished from the power supply that is connected between each power plane and ground. Several of these high frequency bypass capacitors are typically distributed across a printed circuit board.

A conventional high frequency bypass capacitor has a value of approximately 0.1 $\mu$F. Notwithstanding this typical value, the capacitance values of bypass capacitors can range as low as ten's of picofarads (pF) up to several microfarads ($\mu$F). A common surface mount capacitor with a capacitance 0.1 $\mu$F will also have an equivalent series resistance (ESR) of approximately 0.015 ohms ($\Omega$). Capacitor vendors generally try to reduce the ESR to as small a value as possible because of a common belief that low ESR improves the performance of high frequency bypass capacitors.

Figure 2A:
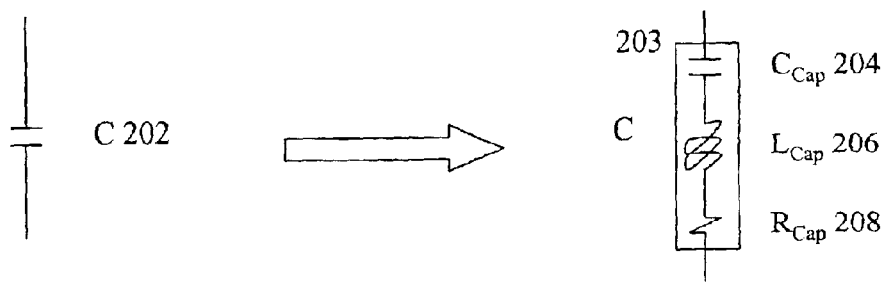
FIG. 2A is a schematic representation depicting the details of a model for a bypass capacitor according to an embodiment of the invention.

Prior art approaches toward minimizing noise and EMI associated with printed circuit boards concentrated their efforts on finding the best values and best placement for high frequency bypass capacitors. Shown in FIG. 2A is bypass capacitor 202 with a corresponding capacitor model 203. As commonly known in the art, capacitor 202 has an associated inductance which is represented in capacitor model 203 as inductor 206 with an equivalent series inductance (ESL). Also as known in the art, capacitor 202 has an associated resistance which is represented in capacitor model 203 as resistor 208 with an equivalent series resistance (ESR). The capacitance of capacitor 202 is modeled as capacitor 204. Importantly, the prior art viewed ESR and ESL in bypass capacitor 202 as undesirable. Thus, the prior art sought to obtain an idealized capacitor with minimal ESR and ESL. Because of this belief, vendors of capacitors will typically tout a low ESR as part of their "high quality" capacitors.

There has been some work in the field to try to reduce noise by tuning capacitor values (see, Larry Smith et al., "Power Distribution System Design Methodology and Capacitor Selection for Modern CMOS Technology," *IEEE Transactions on Advanced Packaging*, Vol. 22, pp. 284–291, August 1999). There have also been some calculations to show that resistive edge termination of a power plane can reduce noise (see, Istvan Novak, "Reducing Simultaneous Noise and EMI on Ground/Power Planes by Dissipative Edge Termination," *IEEE Transactions on Advanced Packaging*, Vol. 22, pp. 274–283, August 1999). These and other prior art findings, however, have not explored the merit of increasing series resistance on a bypass capacitor.

Figure 2B:
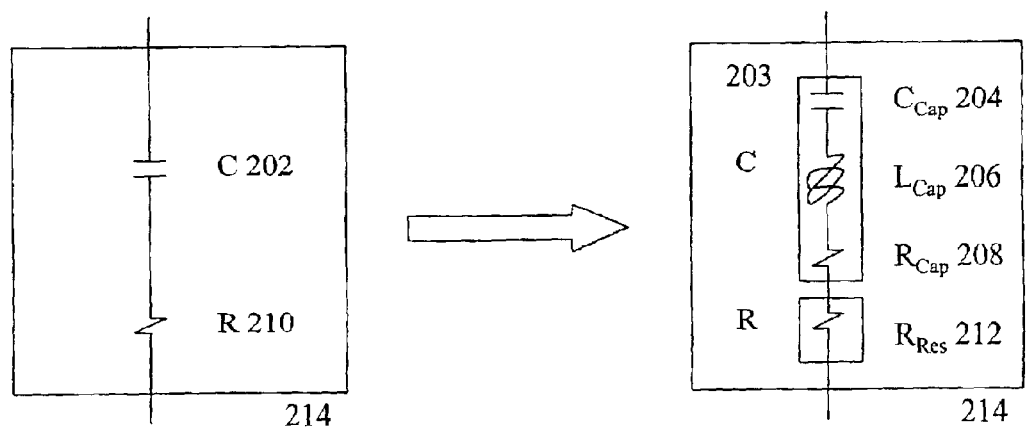
FIG. 2B is a schematic representation depicting the details of a model for a bypass component that includes a bypass capacitor and a bypass resistor coupled in series according to an embodiment of the invention.

The findings of the present invention go contrary to the reasoning of the prior art. In the present invention it is observed that by increasing the series resistance of a bypass capacitor, unwanted voltage noise is attenuated thereby reducing EMI. Increasing the series resistance of a bypass capacitor is most easily achieved by including resistor 210 in series with capacitor 202 as shown in FIG. 2B. Alternatively, capacitor 202 can be made to have an inherently larger ESR. Moreover, bypass resistor/capacitor package shown as bypass component package 214 can be made that includes a capacitor and a resistor. The model for capacitor 202 is as was described with reference to FIG. 2A. The model for resistor 210 can be simply resistor 212. Resistor 210 will typically have an associated inductance which can also be included or can be added to inductor 206. Through modeling of a printed circuit board with its power/ground plane and bypass components including bypass capacitors and series coupled bypass resistors, a resistance for the bypass resistors can be determined that minimizes or at least reduces noise and EMI. These finding will be further discussed below.

Figure 2C:
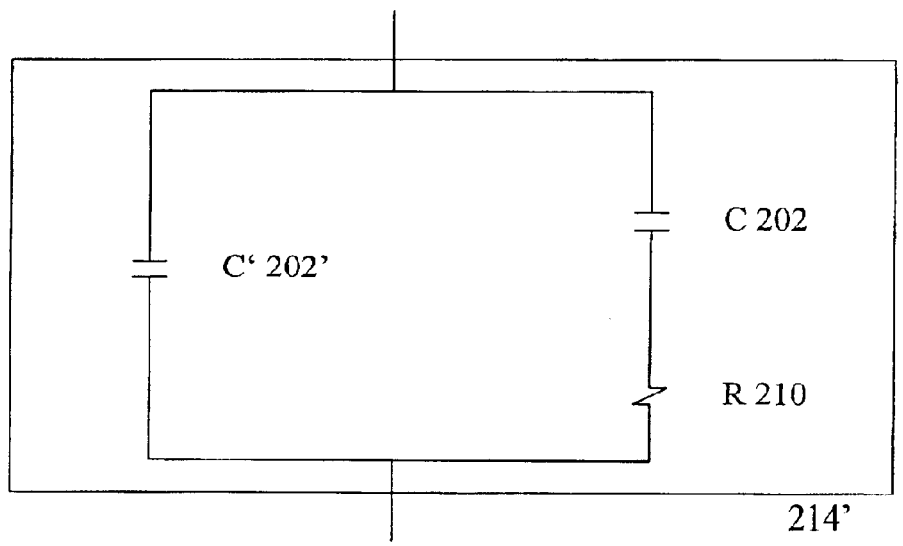
FIG. 2C is a schematic representation depicting the details of a model for a bypass component that includes a bypass capacitor and a bypass resistor coupled in series with a further capacitor coupled in parallel according to an embodiment of the invention.
Figure 2C:
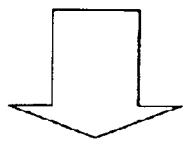
Figure 2C:
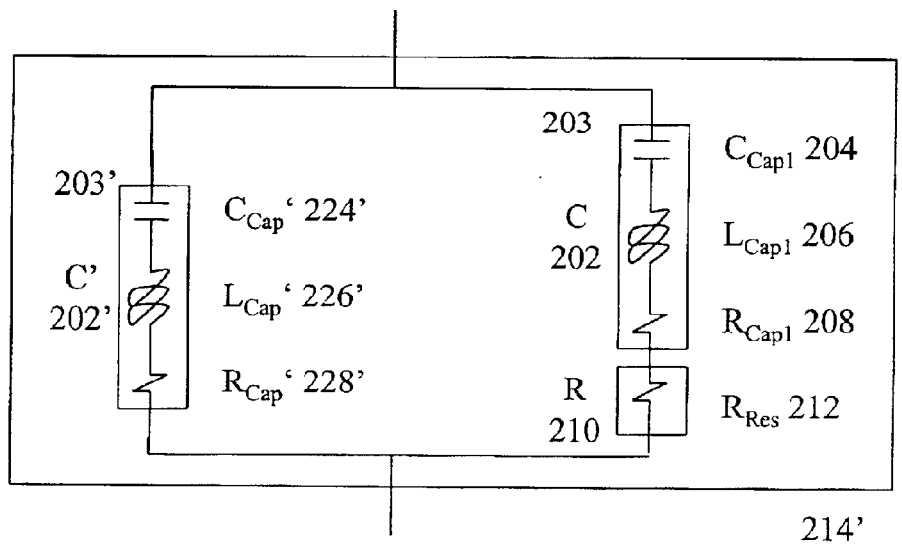

In another embodiment of the invention shown in FIG. 2C, a second capacitor 202' is placed in parallel to the series coupled capacitor 202 and resistor 210. One configuration encloses these various components within a bypass component package 214'. Because the various components can be manufactured to have small dimensions, bypass component package 214' can have physical dimensions substantially similar to bypass component package 214 described with reference to FIG. 2B. With regard to modeling of the various components, series coupled capacitor 202 and resistor 210 are modeled as previously described with reference to FIG. 2B. The second capacitor 202' of FIG. 2C can be modeled in a substantially similar manner to that described for capacitor 202 of FIGS. 2A and 2B. To complete the model, parallel connections of these various models are also modeled as shown in FIG. 2C. As will be described with reference to FIGS. 7A through 7B, this embodiment provides improved low frequency and high frequency response.

In the description of the present invention, modeling and computational tools are described that can significantly reduce the costs of designing a printed circuit board that meets predetermined specifications. Indeed, advances in the computational arts have made the use of modeling and computer aided design (CAD) a preferred approach. Accordingly, methods and steps of the present invention are described for implementation in a microprocessor-based computer system. One of skill in the art will understand that certain of the steps to be described can be performed in a different order than what will be described here. Moreover, one of skill in the art will understand that certain steps can be performed in parallel to decrease computational times. An appropriately configured microprocessor-based system, as known in the art, includes, but is not limited to, a memory communicatively coupled to a microprocessor. Such memory can include random access memory (RAM) or memory in the form of hard disks or read only memories (e.g., CD-ROM). The microprocessor-based computer system can further be coupled to input devices such as a mouse or keyboard, and output devices such as a display or printer.

Figure 3A:
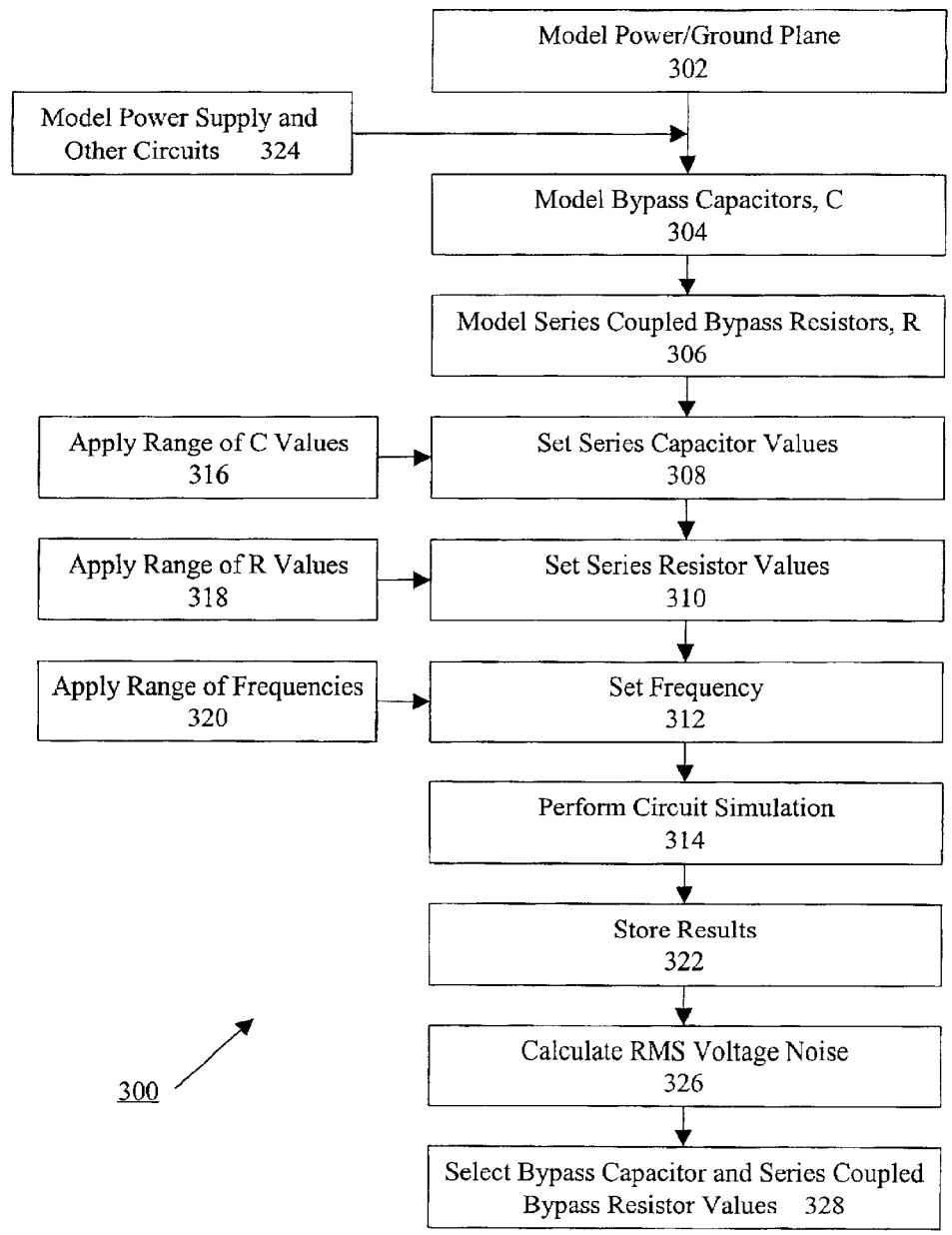
FIG. 3A is a flowchart of a method for determining values for a bypass capacitor or bypass resistor coupled in series according to an embodiment of the invention.

Shown in FIG. 3A is a flowchart for a method 300 of the present invention. At step 302 of FIG. 3A, a power/ground plane is modeled. The modeling of the power/ground plane can be performed using general purpose circuit simulation software products such as SPICE or other similar products. SPICE or other similar products are software products of general applicability, such that, for the purposes of the power/ground plane modeling necessary in the present invention, they may be slow in providing results. Alternatively, specialized software modeling products consistent with the teachings of the present invention can be developed to produce the necessary modeling and simulation. The parameters for a model of the power/ground plane will be discussed further below such that the described model can be analyzed in a circuit simulation product, be it one of general applicability or one specially designed for modeling of a power/ground plane. Returning to the description of FIG. 3A, bypass capacitors will be used in the present invention, so the bypass capacitors are modeled at step 304. Moreover, bypass resistors are introduced in series with the bypass capacitors; such bypass resistors are, therefore, modeled at step 306. The discussion of circuit simulation programs is further applicable to the bypass capacitors and series coupled bypass resistors. Accordingly, the bypass capacitors and series resistors will be included, or superimposed, on the power/ground model discussed above and to be discussed further below. Because the models for the power/ground plane, the bypass capacitors and series resistors can be frequency dependent, a circuit simulation frequency is set at step 312. Method 300 of FIG. 3A is an iterative method that sets values to the bypass capacitors at step 308, the resistance values at step 310 and the frequency at step 312 so as to have a complete circuit model for performing a circuit simulation at step 312. Thus, in an embodiment of the invention, a range of capacitances is applied at step 314, a range of resistances is applied at step 316 and a range of frequencies is applied at step 320. The various results from multiple application of the circuit simulation of step 314 are then stored in an appropriate medium such as a hard disk.

A printed circuit board acts as a substrate for supporting multiple integrated circuits. Moreover, such integrated circuits must be powered by at least one power supply. Accordingly, in another embodiment of the invention, power supplies and integrated circuits are modeled at step 324. Such models can then be superimposed on the model of the power ground plane. With the stored circuit simulation results, RMS voltage noise is calculated at step 326 for all capacitances and resistances used over the frequencies of interest. In an embodiment, the RMS calculations are performed across frequency and space, space being locations (e.g., x, y coordinates) on the printed circuit board. With noise estimates for a given set of capacitances resistances and other factors (e.g., power supplies and circuits), at step 328, values for the capacitances and resistances can be selected that minimize or reduce noise as measured by RMS voltage.

Figure 3B:
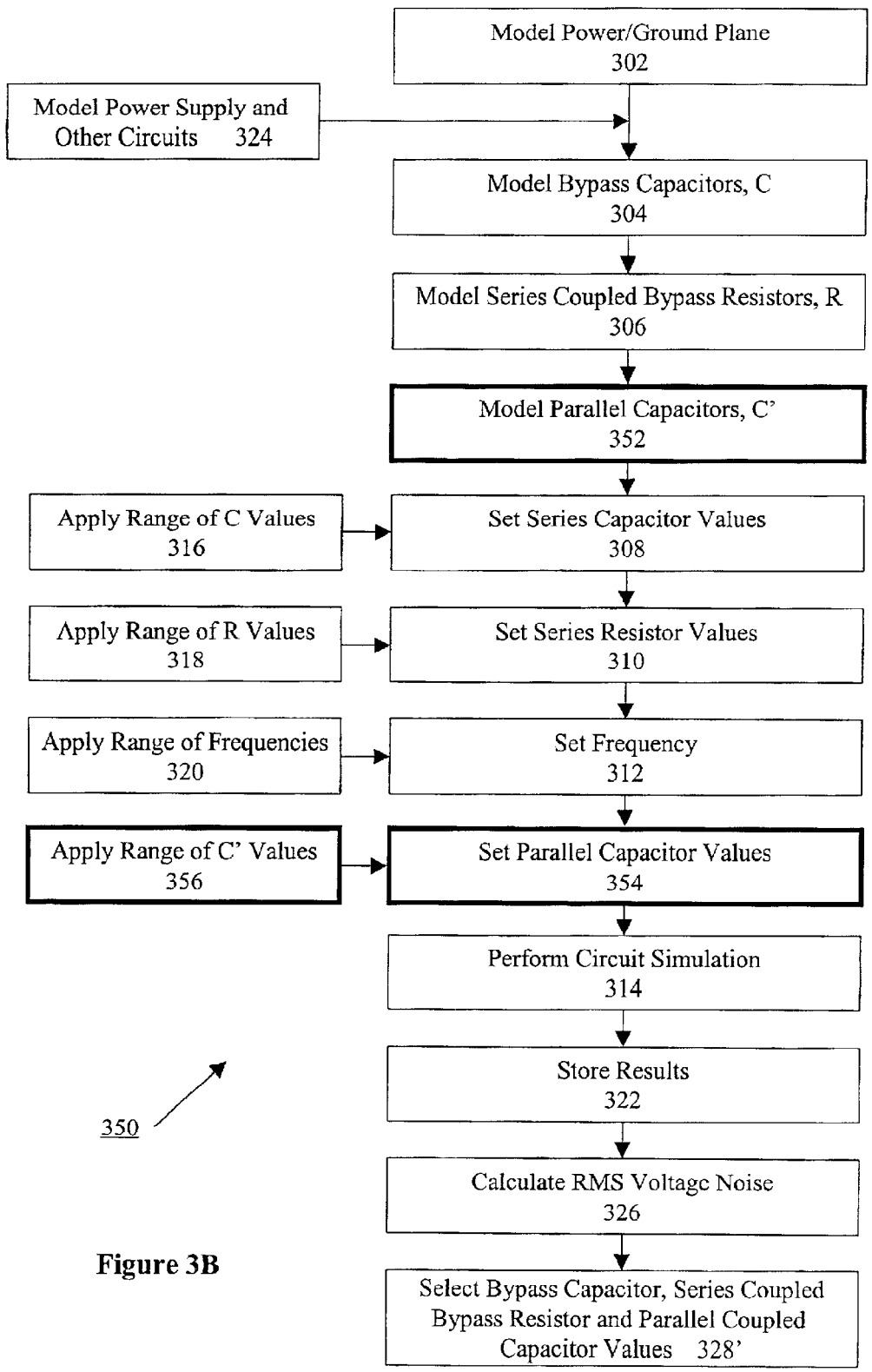
FIG. 3B is a flowchart of a method for determining values for a bypass capacitor or bypass resistor coupled in series, or a further capacitor coupled in parallel according to an embodiment of the invention.

In another method of the invention, a second capacitor as described with reference to FIG. 2C is also modeled and simulated. Shown in FIG. 3B is a flowchart for a method 350 of the present invention. The method 350 includes steps 352, 354, and 356 as a modification of method 300 previously described. Step 352 of method 350 models a second capacitor placed in parallel to the series coupled bypass capacitors and resistors. Method 350 is an iterative method that sets values of the parallel coupled capacitors at step 352. Moreover, a range of capacitances is applied at step 354 for the parallel coupled capacitors. Step 328' is then a modification of step 328 in that values for the parallel coupled capacitors are also set. As will be described with reference to FIGS. 7A through 7D, method 350 can provide improved low frequency and high frequency performance.

It may be possible that RMS voltage noise levels are reduced for a combination of capacitance and resistance values, however, it may also be possible that various combinations of capacitance and resistance produce equally reduced RMS voltage noise levels. Thus, in an embodiment of the invention, all bypass resistors and capacitors are set equal to each other, but in another embodiment of the invention, each bypass resistor and capacitor value are individually set. It should be noted that satisfactory or best solution at any location may result from a combination of high ESR bypass capacitors, low ESR bypass capacitors, or both. In another embodiment of the invention, capacitance and resistance values are chosen such that RMS voltage noise is attenuated below a predetermined level. In this embodiment, it is generally the case that many capacitance and resistance value combinations are appropriate. Although there is a wide range of capacitors and resistors that are commercially available, arbitrary values for capacitors and resistors are not generally available. Accordingly, in an embodiment of the invention, capacitance and resistance values are chosen from commercially available values of capacitance and resistance.

Prior art approaches have used bypass capacitor densities of approximately one or two bypass capacitor per square inch. This range of bypass capacitor density is appropriate for use in the present invention. Other densities are, however, also appropriate for different types of printed circuit boards as can be determined using the methods of the invention. In an analysis to be further discussed infra, different bypass component densities were considered. Upon understanding the present disclosure, one of skill in the art will understand how to model, analyze and apply different densities.

The present invention was analyzed by modeling a power/ground plane along with bypass capacitors and resistors (collectively bypass components) as described with reference to FIGS. 3A and 3B. Briefly stated, electrical calculations were performed by first creating a segmented electrical model of the power/ground plane (see, Becker, et al, "Modeling, Simulation, and Measurement of Mid-Frequency Simultaneous Switching Noise in Computer Systems," *IEEE Transactions on Components, Packaging, and Manufacturing Technology— Part B*, Vol. 21, pp. 157–163, May 1988; and, Wu, et al., "Accurate Power Supply and Ground Plane Pair Models," *IEEE Transactions on Advanced Packaging*, Vol. 22, pp. 259–265, August 1999). An RLC model of each bypass component was placed at the nearest node to its actual location in the segmented plane model, such a model accounts for each bypass capacitor and resistor. Circuit simulations were then performed over various values for the bypass capacitors and resistors; circuit simulations were further performed over a range of frequencies.

Figure 4A:
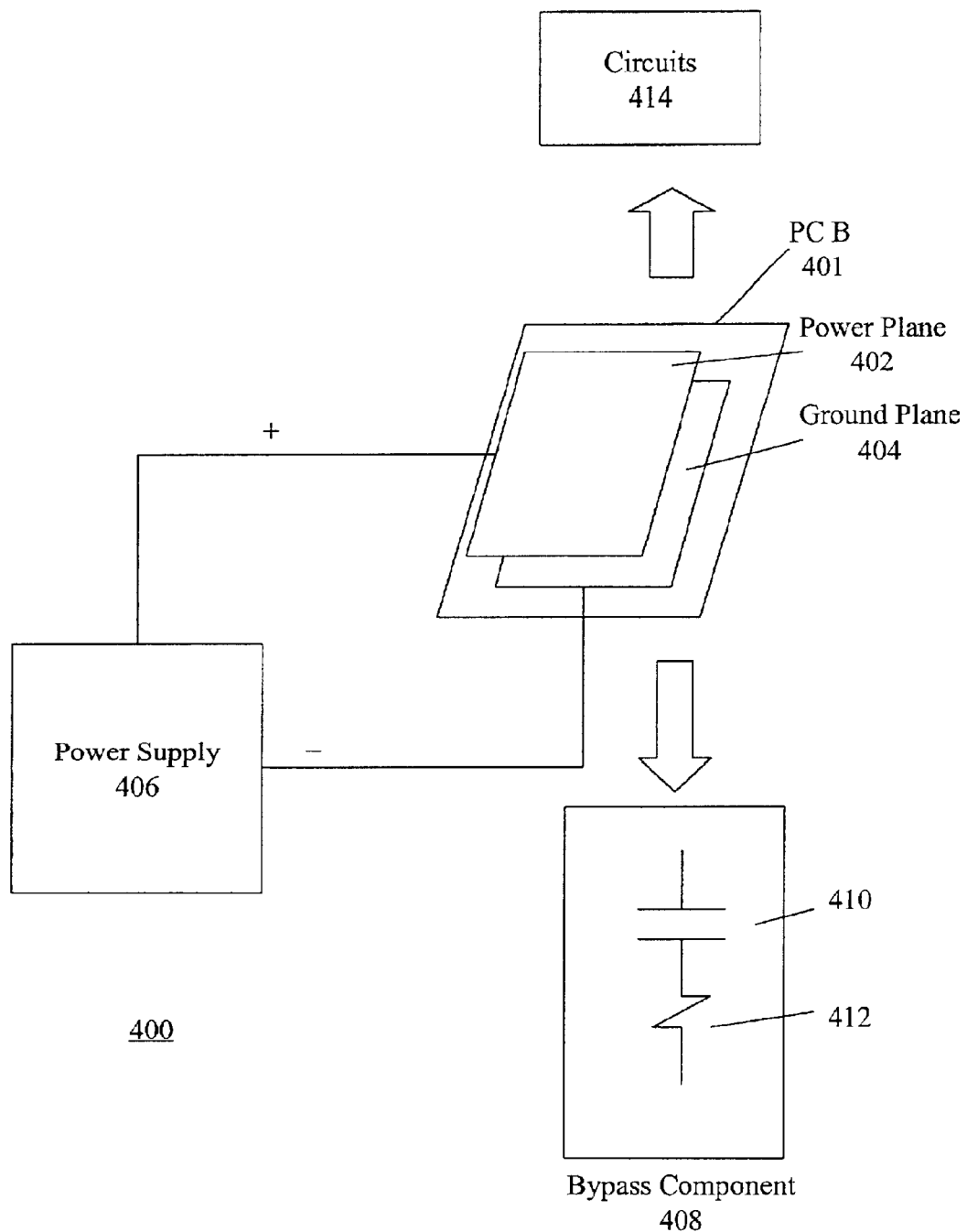
FIG. 4A is a schematic diagram of various components that can be electrically coupled to a printed circuit board according to an embodiment of the invention.
Figure 4B:
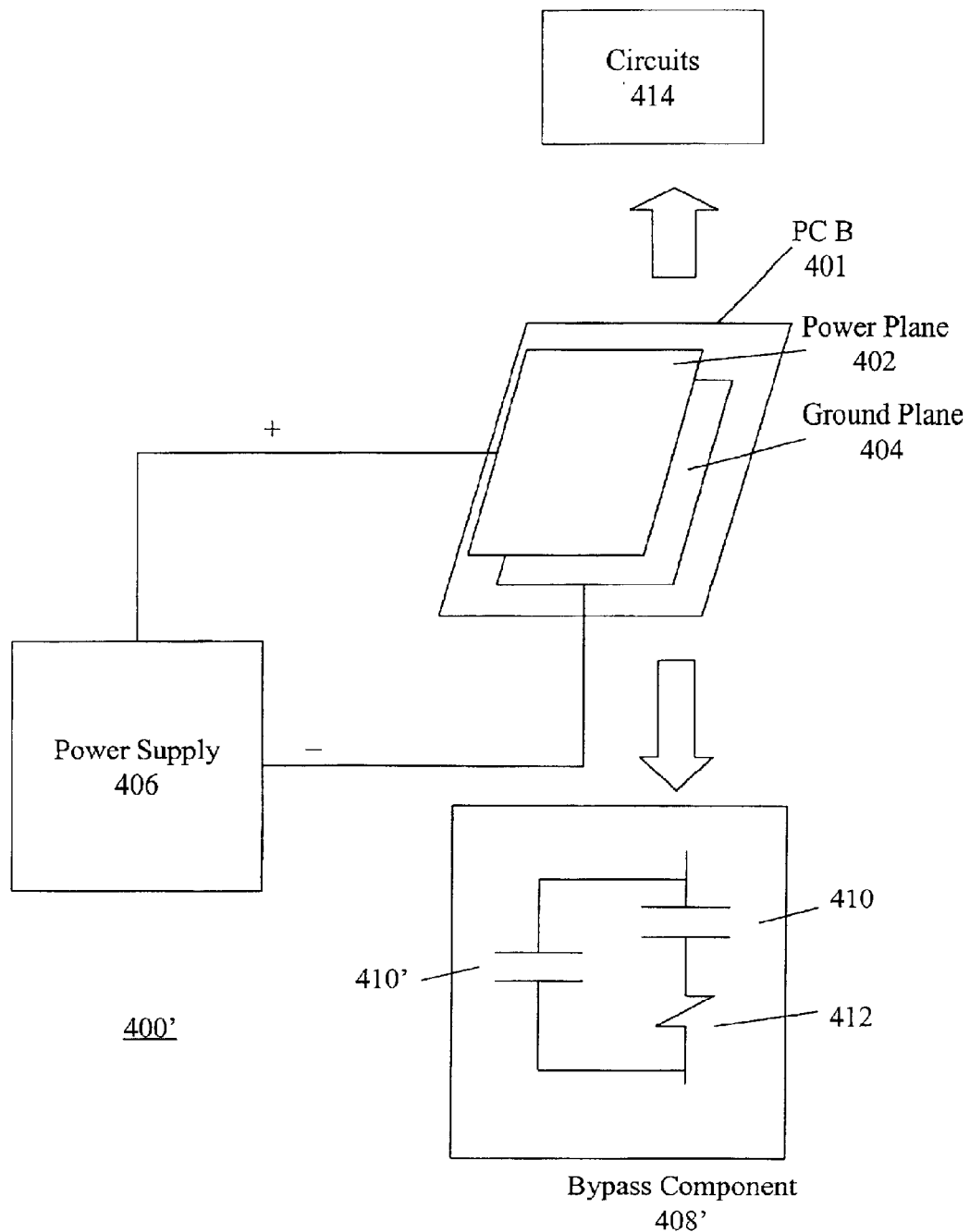
FIG. 4B is another schematic diagram of various components that can be electrically coupled to a printed circuit board according to an embodiment of the invention.

To understand the phenomenon of noise, a circuit simulation model is created to model the effect of noise on a power/ground plane. Shown in FIGS. 4A and 4B are schematic diagrams 400 and 400', respectively, depicting various elements of the circuit simulation model. Central to the present discussion is the power plane 402 and ground plane 404 of a multiple layer printed circuit board 401. Power supply 406 supplies a positive power source to the power plane 402 and further supplies a negative power source to the ground plane 404 (e.g., one polarity or voltage is present on one plane and another polarity or voltage is present on another plane). Further connected to printed circuit board 401 are circuits 414 that include integrated circuits and discrete components. Also connected to printed circuit board 401, as shown in FIG. 4A, are bypass components 408 that include bypass capacitors 410 along with series coupled bypass resistors 412. In another embodiment of the invention, as shown in FIG. 4B, bypass components 408' include bypass capacitors 410, series coupled bypass resistors 412, and parallel coupled capacitor 410'.

Power supply 406 is the voltage source for the system. Accordingly, power supply 406 is modeled as a voltage source along with further models of its characteristic resistance, inductance and capacitance. Where a power supply 406 is external to a printed circuit board, a connector (not shown) is typically used to connect power supply 406 to printed circuit board 401. Such a connector is modeled by a lumped inductance and resistance. The power/ground plane 402/404 model with the bypass components are the important part of the model and will described in more detail below. Circuits 414 are connected to the board through pins that are primarily inductive in the frequency range of interest here. The switching circuits on the circuits 414 are modeled as time-dependent current sources modeling the current draw as producing EMI noise. In seeking to reduce noise on printed circuit board 401, capacitances, either intentional or unintentional, play an important role and should be modeled properly. All levels of packaging for circuits 414 have decoupling capacitance and are accordingly modeled. Bulk capacitors are typically incorporated as part of the power supply 406 model; printed circuit board 401 has a mixture of electrolytic, tantalum, and ceramic capacitors; circuits 414 typically have ceramic capacitors; and, integrated circuits, as part of circuits 414, have intrinsic capacitance plus added thin oxide decoupling capacitors. Thus, these different types of capacitors are appropriately modeled with their respective characteristics.

Figure 5A:
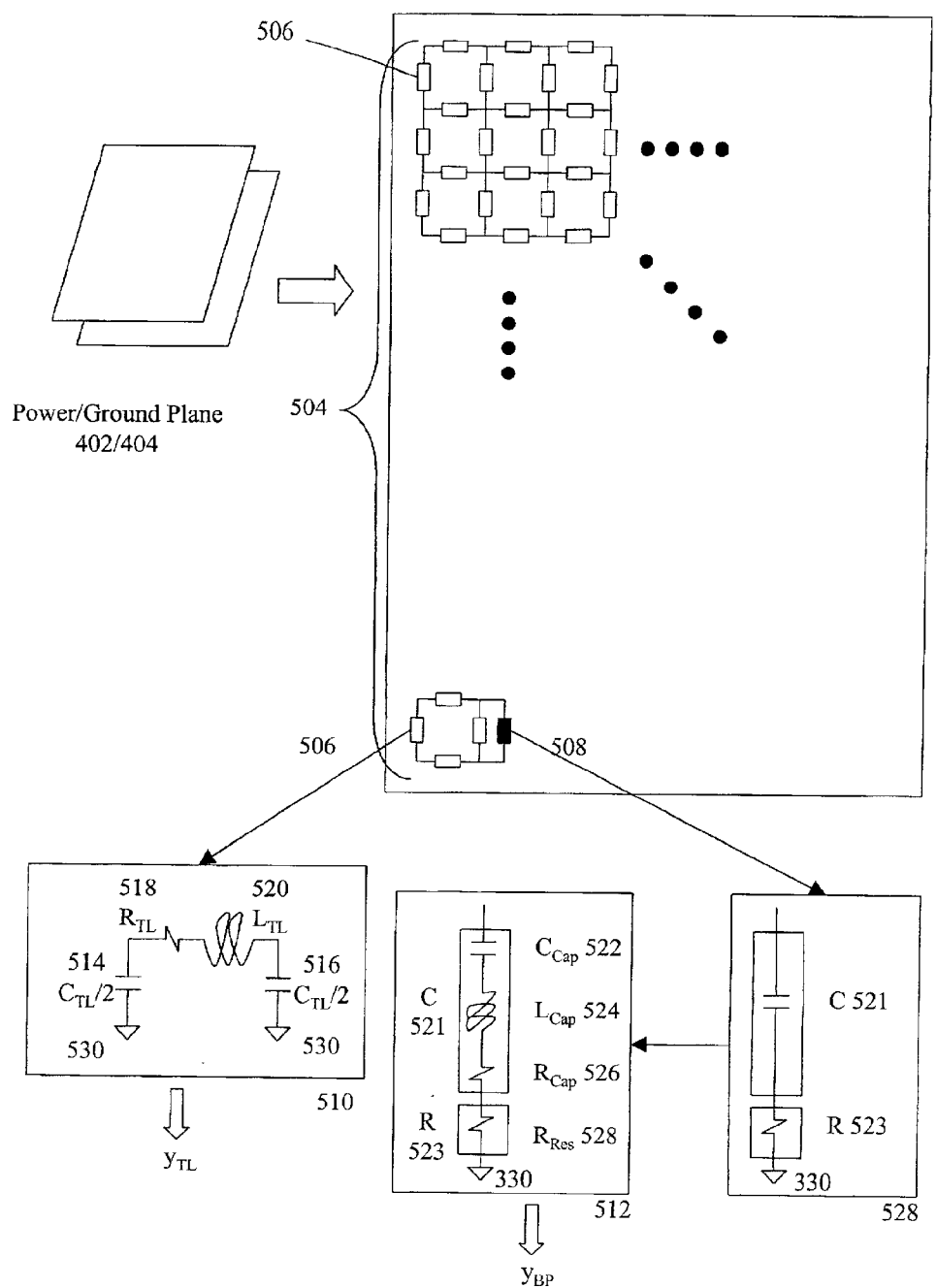
FIG. 5A is a block diagram of a representation for a mesh of transmission lines and bypass components used to represent a power/ground plane according to an embodiment of the invention.
Figure 5B:
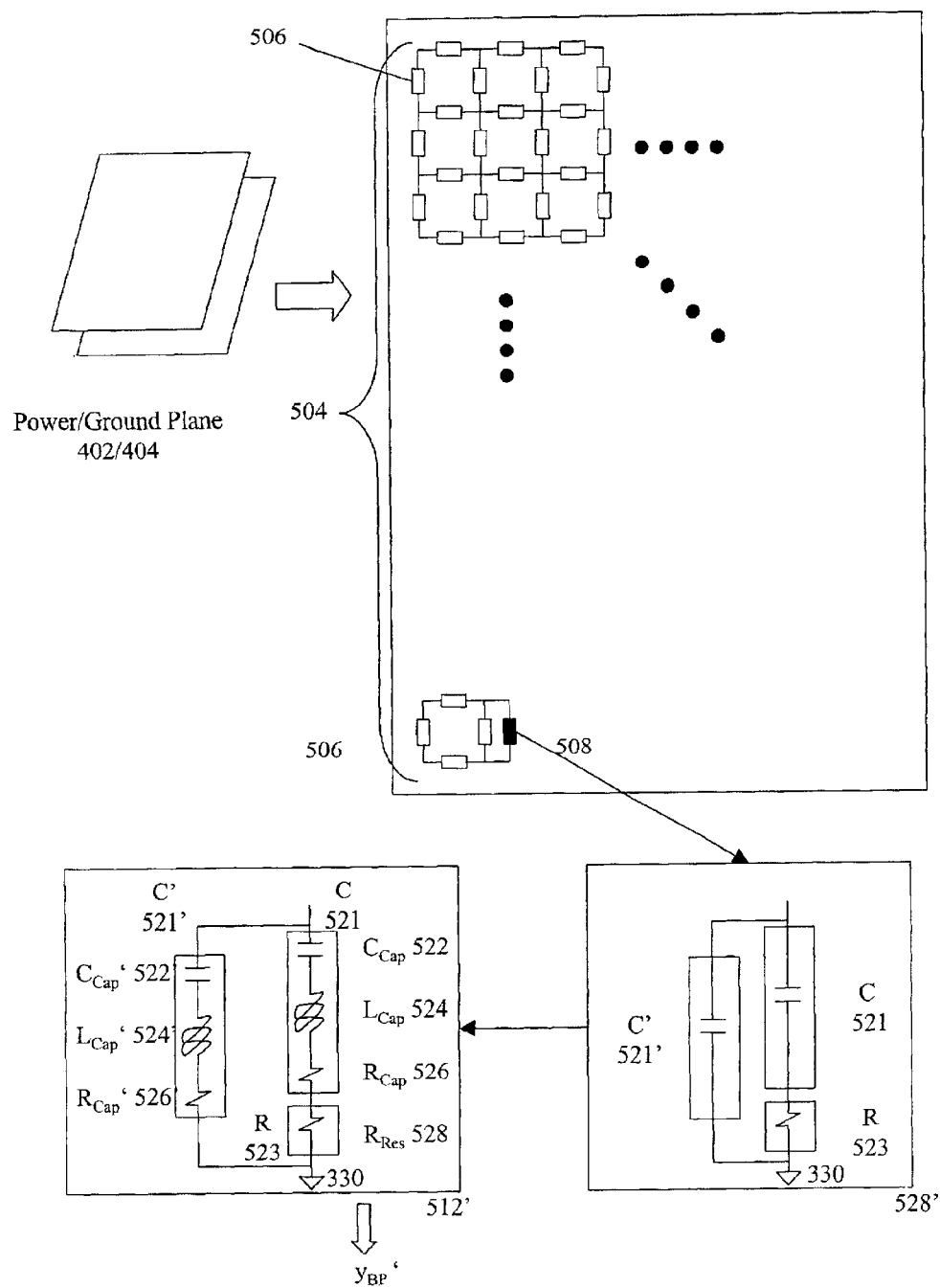
FIG. 5B is another block diagram of a representation for a mesh of transmission lines and bypass components used to represent a power/ground plane according to an embodiment of the invention.
Figure 5C:
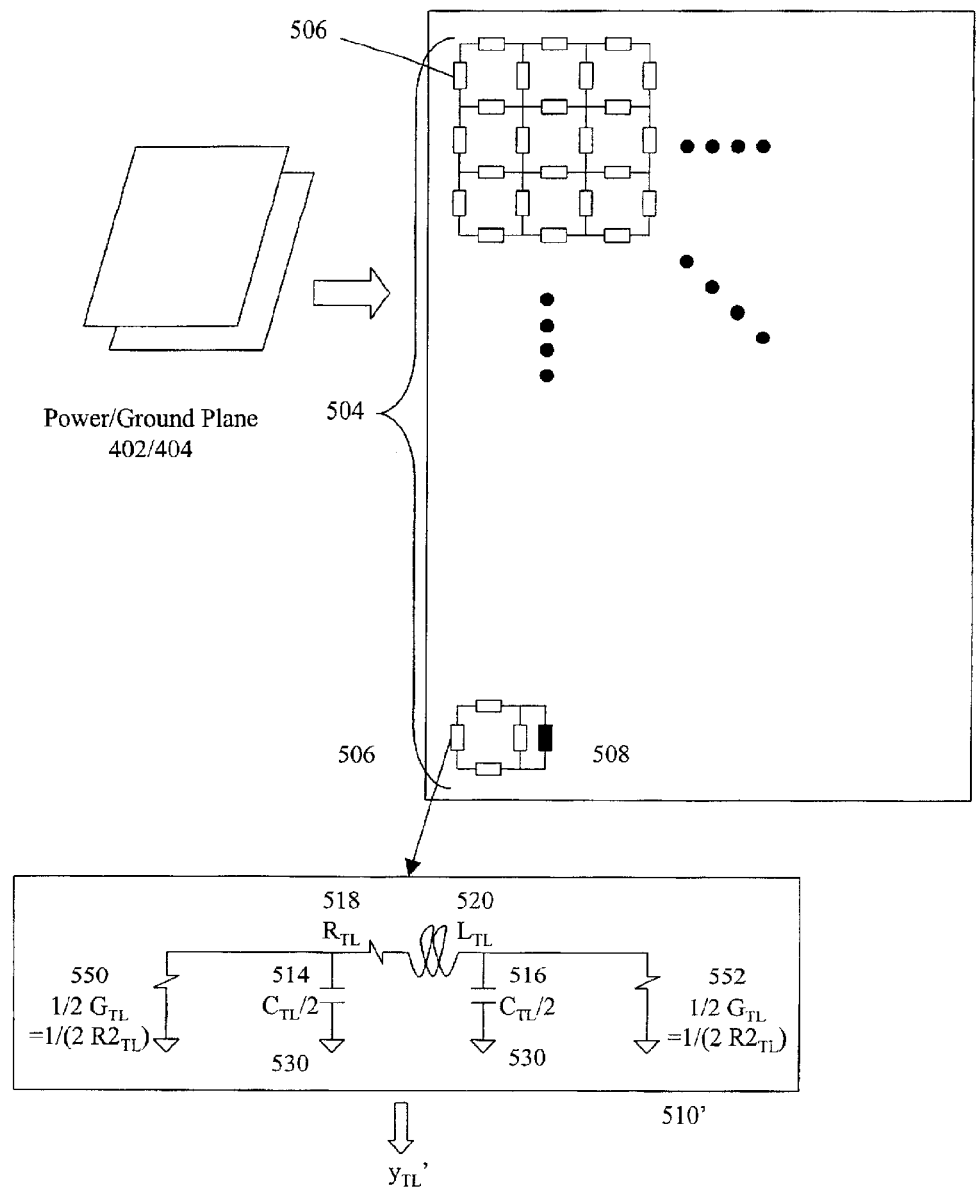
FIG. 5C is a block diagram of a model for transmission lines used to represent a power/ground plane according to an embodiment of the invention.

To build the circuit model of the power/ground plane 402/404, a two-dimensional (2-D) grid of inductors, resistors, and capacitors are developed to build a model of the full board. Collectively, these inductors, resistors, and capacitors are referred to as transmission lines (TLs). Shown in FIGS. 5A, 5B and 5C is power/ground plane 402/404 along with its model representation. In developing the present invention, power/ground plane 402/404 was modeled as a three-inch by six-inch printed circuit board. Such a circuit board was represented as an interconnected mesh 504 of transmission lines 506 as shown in both FIGS. 5A and 5B. Transmission line 506, as shown in box 510, is modeled as resistor 518 having resistance $R_{TL}$, inductor 520 having inductance $L_{TL}$, and two capacitors 514 and 516 each having capacitance $C_{TL}/2$. In the model, capacitors 514 and 516 are connected in parallel to ground 530. Because capacitors 514 and 516, each with capacitance $C_{TL}/2$, are connected to ground 530 in parallel, the total capacitance for transmission line 506 therefore has a value of $C_{TL}$.

The values for resistor 518, inductor 520, and capacitors 514 and 516 are developed for power/ground plane 402/404 as strips of metal having a resistance, inductance, and capacitance. Equations, called stripline equations, have been developed in the prior art to model these parameters. The inductance of inductor 520 is calculated as:

$$L_{TL} = \frac{1}{N}\frac{\mu l d}{w}$$

where $L_{TL}$ is the inductance of the section;
$\mu$ is the dielectric permiability;
l is the length of the section;
d is the separation of the planes;
w is the width of the section; and
N is the number of voltage and ground plane pairs.

Recall that capacitors 514 and 516 have a capacitance value of $C_{TL}/2$. The total capacitance, however, is calculated as:

$$C_{TL} = N\frac{\varepsilon w l}{d},$$

and
where
$C_{TL}$ is the capacitance of the section;
$\in$ is the dielectric permitivity;
w is the width of the section;
l is the length of the section;
d is the separation of the planes; and
N is the number of voltage and ground plane pairs.
Finally, the resistance of resistor 518 is calculated as:

$$R_{TL} = \left(\frac{1}{N_V} + \frac{1}{N_G}\right)\frac{1}{\sigma}\frac{1}{wt}$$

where
$R_{TL}$ is the resistance of the section;
l is the length of the section;
σ is the conductivity of the copper planes;
w is the width of the section;
t is the thickness of the planes;
$N_v$ is the number of voltage planes; and
$N_g$ number of ground planes.

Note that the values $\mu$, l, d, w, $\in$, σ, and t can be determined experimentally. Moreover, typical values are published by CRC Press, for example, that are appropriate for the modeling being described here, the values N, $N_v$, and $N_g$ are set as appropriate for the design being analyzed. Thus, values of $R_{TL}$, $L_{TL}$, and $C_{TL}$, and, therefore, an admittance value, $y_{TL}$, can be calculated for each transmission line 506.

In another embodiment of the invention, a model for transmission line 506 takes into consideration a lossy dielectric between the power and ground planes. As shown in FIG. 5C, transmission line 506 is modeled as shown in box 510' which is similar to box 510 of FIG. 5A except that two other transmission line resistors 550 and 552 are shown in parallel with the capacitors 514 and 516. Because resistors 550 and 552, each with resistance $R2_{TL}/2$, are connected to ground 530 in parallel, the total resistance to ground therefore has a value of $R2_{TL}$. Note that those of skill in the art may refer to the admittance $1/R2_{TL}$ as the admittance $G_{TL}$. Accordingly, an admittance value, $y_{TL}$, can be calculated for each transmission line 506 that accounts for the lossy dielectric.

It should be noted that $R_{TL}$, $L_{TL}$, $C_{TL}$ and $G_{TL}(=1/R2_{TL})$ are values that can vary as a function of frequency. Accordingly, an embodiment of the invention, allows all values to vary with frequency. In another embodiment, the values are not varied as a function of frequency. In yet another embodiment of the invention, some of the values are varied as a function of frequency and other values are not. In embodiments to be described with reference to FIGS. 7A through 7D, for example, the values $L_{TL}$ and $C_{TL}$ are generally assumed constant while $R_{TL}$, because of conductive skin effects, is varied as a square root of the frequency. Moreover, $G_{TL}(=1/R2_{TL})$ is varied by dielectric loss proportional to frequency. In yet another embodiment of the invention, a field solver program as known to those of skill in the art can be used to determine variations as a function of frequency.

In embodiments of the invention to be described with reference to FIGS. 7A through 7D, $R_{TL}$, and $G_{TL}(=1/R2_{TL})$ for a single power/ground pair (i.e., N=1) are given by the frequency dependent equations below. The frequency dependent resistance of resistor 518 is calculated as:

$$R_{TL} = 2\frac{l}{w}\sqrt{\frac{\pi f \mu}{\sigma}} \left( \frac{\sinh(2t\sqrt{\pi f \mu \sigma}) + \sin(2t\sqrt{\pi f \mu \sigma})}{\cosh(2t\sqrt{\pi f \mu \sigma}) - \cos(2t\sqrt{\pi f \mu \sigma})} \right)$$

where
$R_{TL}$ is the resistance of the section;
l is the length of the section;
σ is the conductivity of the planes;
μ is the dielectric permeability;
w is the width of the section;
t is the thickness of the planes;
f is the frequency;
sin is the sine;
cos is the cosine;
sin h is the hyperbolic sine, and
cos h is the hyperbolic cosine.

The frequency dependent conductance of resistors 550 and 552 in parallel with the capacitors 514 and 516 is given by:

$$G_{TL} = 2\pi f C_{TL} \tan \delta$$

where
$G_{TL}$ is the admittance of the section to ground;
f is the frequency;
$C_{TL}$ is the transmission line capacitance calculated above; and
tan δ is the loss tangent.

Note that the loss tangent, tan[δ], is provided for many dielectric materials by manufacturers who use these materials in printed circuit boards. A commonly given loss tangent for FR-4 is 0.02.

Also in the embodiment to be described with reference to FIGS. 7A through 7D, the inductance of inductor 520 is calculated as:

$$L_{TL} = \frac{\mu l d}{w}$$

where
$L_{TL}$ is the inductance of the section;
μ is the dielectric permeability;
l is the length of the section;
d is the separation of the planes; and
w is the width of the section.

Note that N (the number of planes) is set equal to 1. Recall that capacitors 514 and 516 have a capacitance value of $C_{TL}/2$. In the embodiment to be described with reference to FIGS. 7A through 7D, the total capacitance is calculated as:

$$C_{TL} = \frac{\varepsilon w l}{d}$$

where
$C_{TL}$ is the capacitance of the section;
∈ is the dielectric permitivity;
w is the width of the section;
l is the length of the section; and
d is the separation of the planes.

Note that here again, N (the number of voltage planes) is set equal to 1. Although the parameters to be used in the embodiment to be described with reference to FIGS. 7A through 7D are for a single power/ground plane pair (i.e., N=1), one skilled in the art can extend the equations to multiple power/ground planes (i.e., N≧1) in parallel by creating a transmission line model of the interconnect properties.

Returning to the model of FIG. 5A, an accurate model of the on-board bypass component 508 is needed. This model consists of the capacitors at the operating conditions to which they are subjected and the parasitics of the leads and vias that connect them to the planes on the board. According to an embodiment of the invention, bypass component 508 is comprised of a capacitor 521 connected in series to a resistor 523 as depicted in box 528. In a simplistic model, capacitor 521 is modeled as just a capacitor and resistor 523 is modeled as just a resistor. A more accurate model, however, models capacitor 521 as a capacitor 522, inductor 524, and resistor 526 connected in series as depicted in box 512. Such a model accounts for real-world characteristics of capacitors to be implemented on power/ground plane 402/404. In this more accurate model, resistor 523 is modeled as a resistor 528. Resistor 523 can be further modeled with a characteristic inductance, however, any such inductance can be incorporated in inductor 526. From this model, an admittance value, $y_{BP}$, is calculated for each bypass component 508.

To complete the model for FIG. 5B, a second capacitor 550 is also modeled wherein the second capacitor 521' is connected in parallel to bypass capacitor 521 and resistor 523. The model for the full model for second capacitor 521' is shown within box 521'. The model for the second capacitor 521' is similar to bypass capacitor 521, wherein the model for the second capacitor 521' includes capacitor 522', inductor 524', and resistor 526'. From this model, an admittance value, $y_{BP}'$, is calculated for each bypass component 508'.

A circuit mesh 504 is built out of transmission lines 506 as shown in FIG. 5A. A model of a three-inch by six-inch board can be modeled by building a mesh of half-inch by half-inch sections. This circuit model extends to the size of the board and can further be modeled as being electrically connected to power supply 406, circuits 414, and bypass components 508 or 508' at appropriate points on mesh 504.

Circuits 414 are the main source of current that produce mid-frequency noise. A model of circuits 414 can be important because it distributes the current from integrated circuits or "chips" to the board. In such model, each chip site is modeled as an inductance representing the voltage and ground vias and pins of circuit 414. The chip site model is connected to each other and to bypass component 508 or 508' sites with an inductance model representing the mesh planes in circuit 414. This modeling approach takes advantage of all the logic chips in a system. If more voltages are distributed on the board and the interaction between the voltage planes is to be monitored, the model becomes more complex and an approach using inductance parasitic extraction tools as known in the art becomes necessary.

Conversely, toward understanding just the characteristics of power/ground plane 402/404, only the power/ground plane 402/404 and bypass components 508 or 508' need to be modeled. Results obtained from this type of modeling will, nonetheless, provide adequate information as to the characteristics of a power/ground plane with bypass components 508 or 508'. Bypass components 508 or 508' provide improved performance with respect to noise suppression such that when circuits 414 are included on power/ground plane 402/404, the improved performance will remain. In fact, where power/ground planes 402/404 are developed for general application, this simplified modeling is a preferred approach.

Mathematical modeling has shown that increasing the resistance of bypass resistor 523 in series with bypass capacitor 521 substantially attenuates the noise on the power/ground plane. This is exactly opposite of conventional wisdom which attempts to minimize a bypass capacitor's equivalent series resistance (ESR) modeled as resistor 526. Increasing the resistance of resistor 523 can be done by external resistors in series with the capacitor, a resistance added to the capacitor by a capacitor vendor, or a lossy dielectric used by the capacitor vendor to increase the series resistance of capacitor 521. Testing has shown that in a three-inch by six-inch printed circuit board, effective resistor values range from 0.5 ohms to more than 100 ohms, depending on the characteristics of a particular power/ground plane design.

In regards to this analysis, the following will be a brief tutorial of basic circuit modeling. Recall Ohm's law that states that for a resistive circuit, voltage is directly proportional to the applied current and resistance:

$$v=ri$$

where i is the applied current;

r is the resistance of a resistive component such as a resistor; and v is the resulting voltage.

With algebraic manipulation, the above equation becomes:

$$i=(1/r)v=r^{-1}v.$$

The inverse of the resistance, $r^{-1}$, is called conductance and is represented by the variable g, such that the above equation can be rewritten as:

$$i=gv=g^{-1}r.$$

In a more general form, Ohm's law states that for a circuit with an impedance, voltage is directly proportional to the applied current and impedance:

$$v=zi$$

where i is the applied current;

z is the impedance of a component or circuit; and v is the resulting voltage.

With algebraic manipulation, the above equation becomes:

$$i=(1/z)v=z^{-1}v.$$

The inverse of the impedance, $z^{-1}$, is called admittance and is represented by the variable, y, such that the above equation can be rewritten as:

$$i=yv.$$

It should be noted that in the art to which it pertains, the terms admittance and conductance are sometimes used interchangeably.

The above equations have been described in scalar form, however, corresponding matrix form equations can also be developed. Corresponding to the scalar equation $$i=yv$$

is the matrix equation $$I=YV$$

where

I is a column vector with n rows representing n currents;

V is a column vector with n rows representing n voltages; and

Y is a square matrix having n columns and n rows representing admittances of various components in a circuit.

The number, n, corresponds to the number of nodes being analyzed. For example, with reference to mesh 504 of FIG. 5A, where mesh 504 has p vertical nodes and q horizontal nodes, n is equal to the product of p and q (i.e., n=p q).

In the modeling being described, the admittance matrix, Y, is developed for mesh 504 having transmission lines 506, bypass components 512 connected to mesh 504 as well as power supply 406 and circuits 414. Each of these components can be modeled with their respective impedances and, therefore, their respective admittances. Such admittances are used in the elements of admittance matrix, Y. As known in the art, nodal analysis applying Kirchoff's Current Law (KCL) is used to develop node equations that provide the elements of admittance matrix, Y.

In the analysis being described here, the desired information are the voltages of column vector V. Accordingly, in applying matrix manipulation, the inverse, $Y^{-1}$, of the matrix Y is necessary to solve for the column vector V. The solution is therefore:

$$Y^{-1}I=Y^{-1}YV$$

$$Y^{-1}I=V.$$

Rewriting this result, we have:

$$V=Y^{-1}I.$$

Because the number n, corresponding to the number of columns or rows of Y, can be very large, Y can be a very large matrix. Moreover, inverting a very large matrix can be a computationally intensive task.

One of skill in the art would not manually develop the admittance matrix, Y, nor attempt to manually compute its inverse. Rather, one of skill in the art would use a commercially available product such as SPICE or other similar software product, or other specialized software products. Such products typically provide a user-friendly interface for defining a circuit such as mesh 504 with transmission lines 506, bypass components 508 (or 508') as well as all the other components described supra. Moreover, such a product typically performs the necessary calculations to extract the proper voltages and will typically also provide other analytic features.

Figure 6:
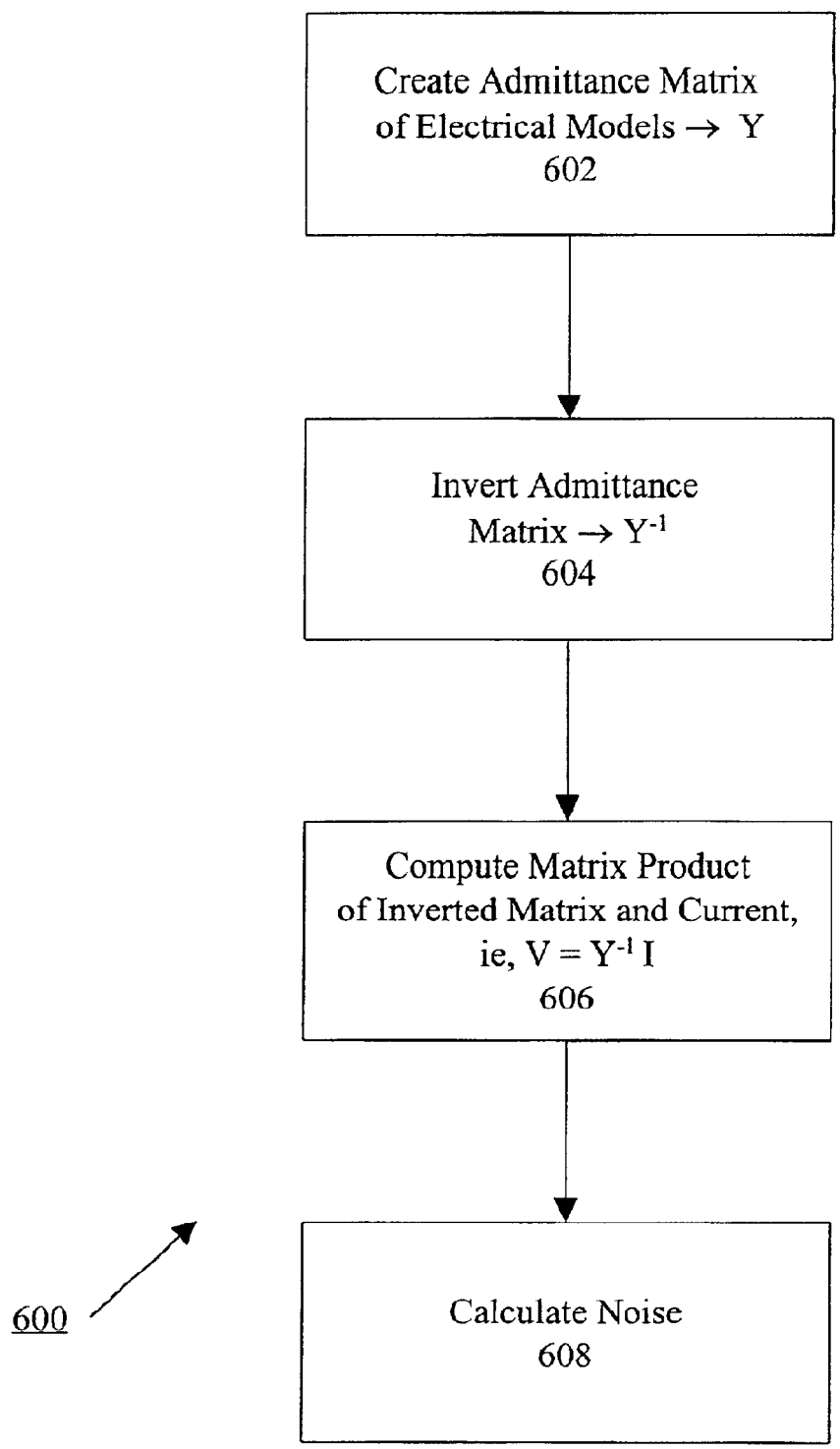
FIG. 6 is a flowchart of a method for performing a circuit analysis according to an embodiment of the invention.

Commercially available products such as SPICE and other products, however, are provided for applicability to any type of circuit analysis. Accordingly, certain tasks such as matrix inversion and noise calculations may not be performed in a manner efficient for the purposes being described here. Accordingly, one of skill in the art can develop a specialized analytic tool. Shown in FIG. 6 is a method 600 for performing circuit simulation consistent with previously described step 314 of FIG. 3A. In method 600, an admittance matrix, Y, is created at step 602. The admittance matrix represents the various electrical models with their associated admittances as described supra. At step 604, the admittance matrix, Y, is inverted to generate matrix $Y^{-1}$. To invert matrix Y requires on the order of $n^2$ calculations, where n is the number of rows and columns in the admittance matrix, Y. In performing the analysis of the present invention, however, it may be the case that the entire matrix does not need to be inverted such that less than $n^2$ operations may be necessary. This is the type of optimization that can be implemented in a specialized circuit analysis software product that is not necessarily available in commercially available products. With inverted admittance matrix, $Y^{-1}$, node voltages are obtained at step 606 by computing the matrix product of the inverted matrix, $Y^{-1}$, and the current source, I (i.e., $V=Y^{-1}$ I). A current source could therefore be applied at any node to determine the voltage response of an entire circuit including power/ground plane 402/404 of the present invention. Moreover, although the steps of method 600 can be executed in the time domain, they can be more efficiently calculated in the frequency domain. As noted, the present invention provides the reduction of noise on power/ground plane 402/404. To measure the amount of such noise, a root mean squared (RMS) voltage response is calculated at step 608 by integrating the RMS voltage over the frequency range of interest.

A model was created with the power/ground plane 402/404 spacing of four (4) mils. A single 100 µF capacitor was also placed on the board to provide low frequency bypassing. A 0.1 µF capacitor was placed on a square grid with one-inch spacing for a total of 18 capacitors. Accordingly, capacitor 522 is modeled as a capacitor with a capacitance of 0.1 µF. An equivalent series inductance (ESL) of 1.5 nH was assumed for inductor 524; and an ESR of 10 milliohms was assumed for resistor 526. The PCB was driven at a single node, one inch from a corner of the board, by a switching current source with a 500 picosecond (pS) edge and a 100 MHz pulse repetition frequency (PRF). All of these parameters are representative of a typical present day PCB and circuit technology. These parameters were analyzed in a specialized software tool applying the methods 300 and 600 of FIGS. 3 and 6, respectively.

Under the described conditions, modeling results showed that the PCB produced an RMS noise voltage of approximately 660 mV RMS across the surface of the board. With a four-ohm bypass resistor 523 placed in series with each of the 0.1 µF bypass capacitor 521, the noise voltage was reduced to 60 mV RMS. This is one-tenth of the previously observed value—a highly desirable result. This significant result can be a very important factor in PCB and IC design especially when needing to meet stringent EMI, RFI or FCC specifications. Moreover, the reduction in RMS noise can be very important toward producing a properly functioning circuit.

Figure 7A:
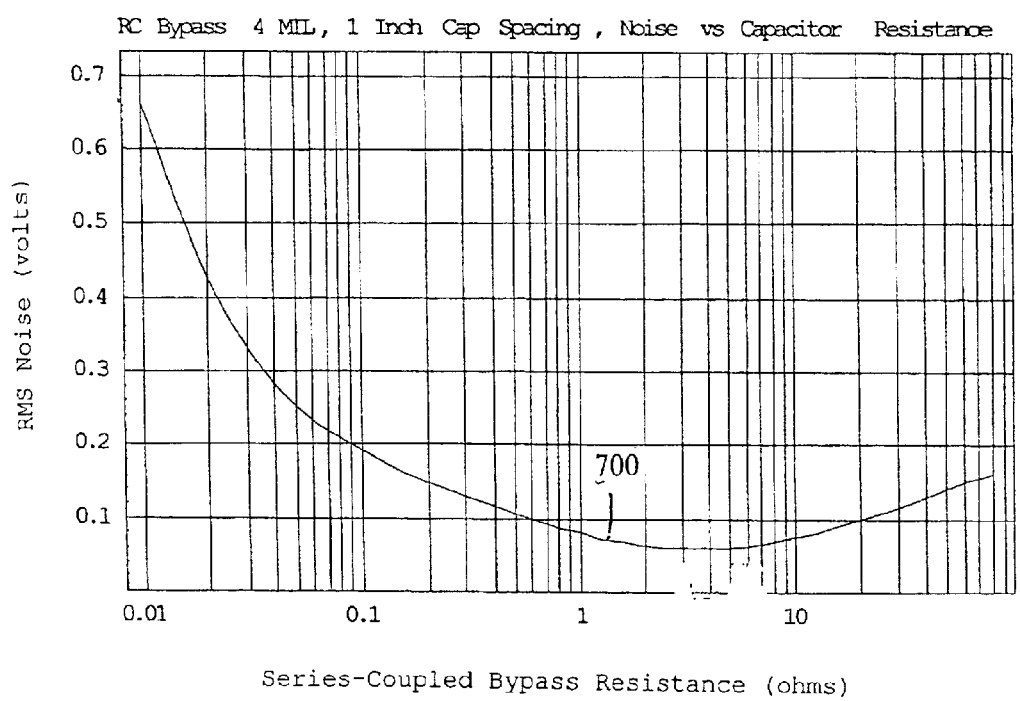
FIG. 7A is a plot of noise measured in root mean squared (RMS) volts versus bypass resistance measured in ohms according to an embodiment of the invention.

A plot 700 of the RMS voltage noise is shown at FIG. 7A. FIG. 7A plots RMS voltage noise over a range of ESR from 10 milliohms to 100 ohms. As shown in FIG. 7A, where resistors 523 have resistance values of 10 milliohms, RMS voltage noise was observed at over 600 millivolts RMS. RMS voltage was observed to decrease with increasing resistance up to a resistance of four (4) ohms. At four (4) ohms, RMS voltage was observed to be at a minimum. Increasing the resistance beyond four (4) ohms resulted in an increase in RMS voltage noise from its minimum. In designing a PCB having bypass capacitors 521 with bypass resistors 523, it is desirable to find a minimum RMS voltage noise using the method 300 of FIG. 3A. Having found a minimum, a designer is assured of an optimized PCB design. In other situations, it may not be necessary to find a minimum, rather it may only be necessary to reduce RMS voltage noise. Accordingly, upon applying the method 300 of FIG. 3A, a designer may choose from a wide range of series resistances until a design is found that meets certain identified specifications. In other words, a designer can choose from a range of series resistances until the design is "good enough" rather than finding a minimum. The results of FIG. 7A reveal that such an approach is appropriate. For example, if a designer desired to reduce RMS voltage noise to levels below 200 millivolts RMS, a designer could choose series resistance values ranging from approximately 100 milliohms to approximately 100 ohms.

As shown in plot 700 of FIG. 7A, the present invention substantially attenuates switching noise that is present on power/ground plane 402/404. It is a substantial improvement that can be implemented in present PCB designs as well as next generation designs. Moreover, the present invention is applicable to many PCB and IC designs operating at higher frequencies.

Figure 7B:
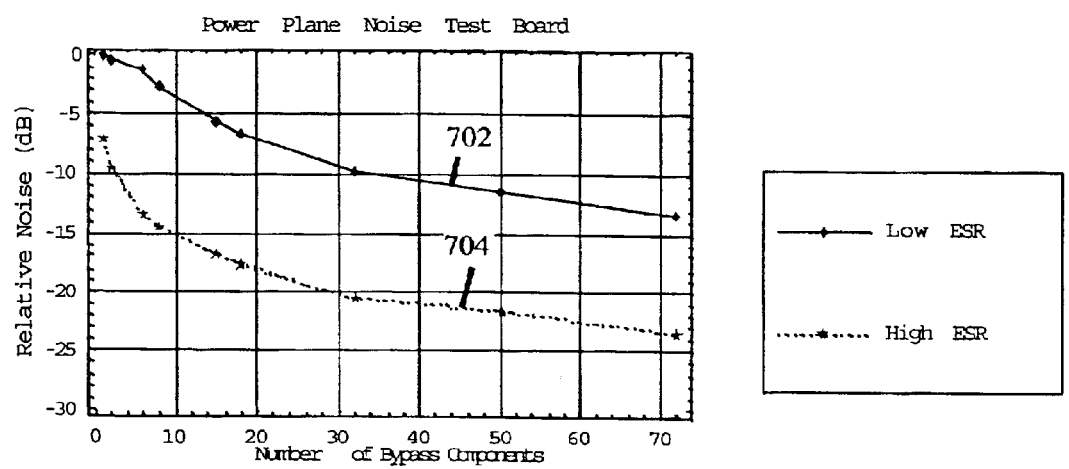
FIG. 7B is a plot comparing relative noise measured in dB versus number of bypass components according to an embodiment of the invention.

Recall that in the present invention, the values of bypass capacitors 521 and bypass resistors 523 were varied as described with reference to FIG. 3A. A further degree of freedom that is available, however, is the number of bypass components 508. For example, in the three-inch by six-inch printed circuit board previously described, the number of bypass components can be varied. Shown in FIG. 7B are two plots 702 and 704. Plot 704 is a plot of measured noise in the model described above where the resistance of bypass resistor 523 is three (3) ohms and the number bypass components was varied from 0 to 70. Moreover, plot 702 is a plot of measured noise in essentially the model described above except that bypass resistors 523 were not included. Thus, plot 702 corresponds to a prior art design. An equivalent series resistance of 0.015 ohms was used for the bypass capacitors of plot 702. Thus, with respect to plot 702 the number of bypass components are the number of bypass capacitors only. Clearly shown in FIG. 7B is the result that even a few bypass components according to the present invention produces results comparable to prior art designs having many more bypass capacitors. For example, six (6) bypass components according to the present invention provide improved performance over a prior art design with 70 bypass capacitors.

Figure 7C:
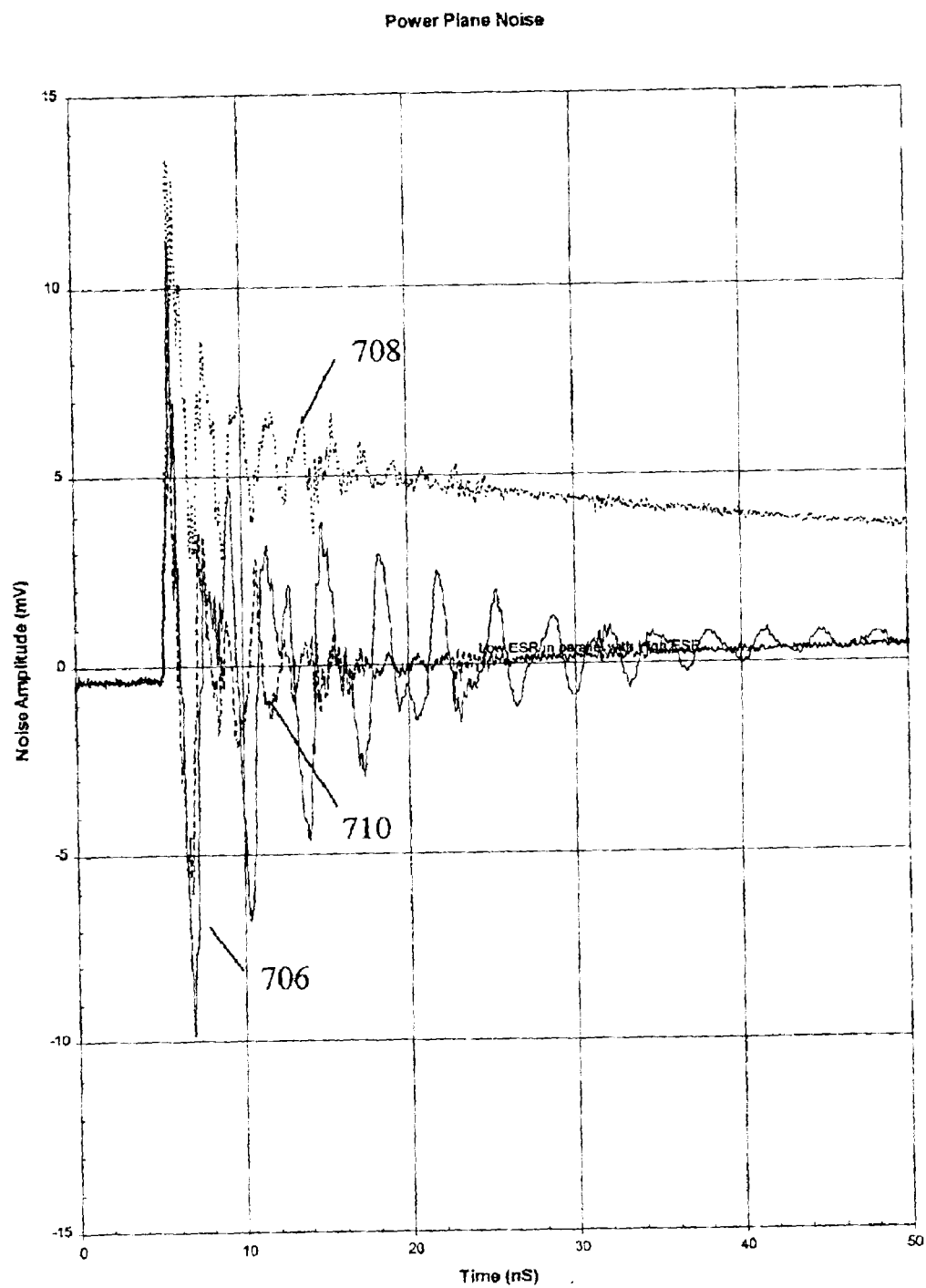
FIG. 7C is a plot comparing impulse responses as a function of time for various configurations according to an embodiment of the invention.
Figure 7D:
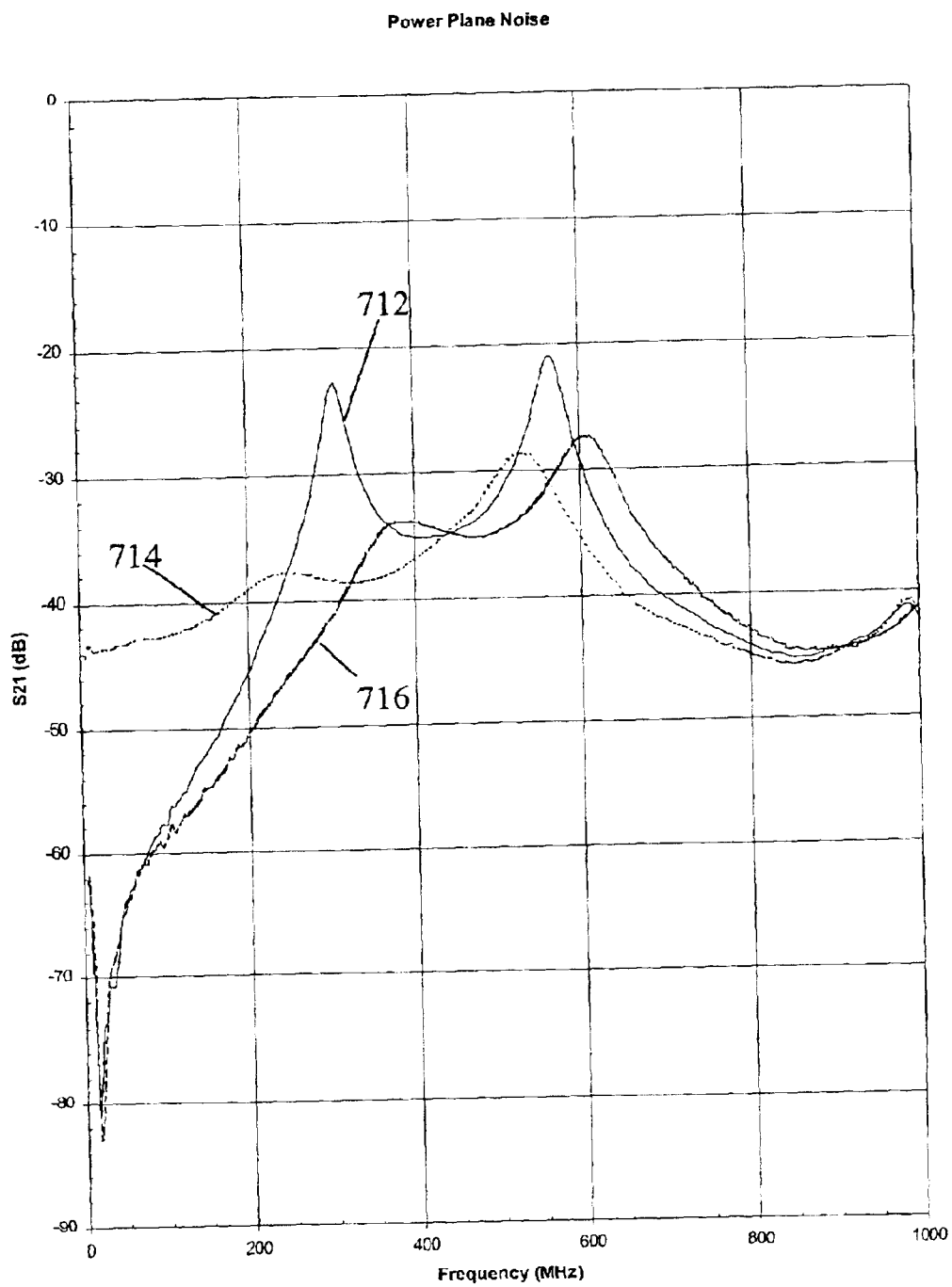
FIG. 7D is a plot comparing impulse responses as a function of frequency for various configurations according to an embodiment of the invention.

Whereas the plots of FIGS. 7A and 7B were theoretical predictions of noise reduction, the plots of FIGS. 7C and 7D are actual measurements taken from a circuit board. Shown in FIG. 7C is a plot comparing impulse responses as a function of time for various configurations according to an embodiment of the invention. Plot 706 is a plot of an impulse response for printed circuit board with 18 conventional 0.01 µF surface mount capacitors that have a low ESR of about 15 milliohms according to the prior art. Plot 706 shows that there is still ringing even after 50 ns. For a high ESR case with a bypass capacitor coupled in series with a resistor, the ringing is damped out by 20 ns as shown in plot 708. For plot 708, a 3 ohm resistor was placed in series with each 0.01 µF capacitor. The upward step function of plot 708 is due to the 3 ohm resistance that does not have much low ESR bypassing. A third case shown as plot 710 includes both the high ESR and low ESR capacitors in parallel. Plot 710 shows improved performance over plots 706 and 708. Importantly for plot 710, ringing dies off quickly without a step function.

FIG. 7D shows the differences of the above three cases in the frequency domain. In order to obtain the results of FIG. 7D, S-parameter analyses were performed for the three cases. In particular, the S21 parameter results between the driving port and the receiving port are plotted. A lower S21 value implies that there will be lower noise on the board. In the first case with a low ESR according to the prior art, plot 712 shows adequate attenuation at frequencies below 200 MHz, but has significant noise peaks at 300 MHz and 550 MHz. In the second case with high ESR capacitors, the two peaks are attenuated as shown in plot 714, but have less attenuation at lower frequencies, as demonstrated by the step function in the time domain plot 708 of FIG. 7C. Using both low ESR and high ESR capacitors in parallel, both low and high frequencies are significantly attenuated as shown in plot 716 of FIG. 7D. Thus, high ESR capacitors provide improvements over the prior art low ESR capacitors. Moreover, high ESR capacitors in parallel with low ESR capacitors can provide even more improvement over the prior art.

The foregoing descriptions of specific embodiments of the present invention have been presented for purposes of illustration and description. They are not intended to be exhaustive or to limit the invention to the precise forms disclosed. Many modifications and variations are possible in light of the above teachings without deviation from the scope of the claims set out below. The embodiments were chosen and described in order to best explain the principles of the invention and its practical application, to thereby enable others skilled in the art to best utilize the invention and various embodiments with various modifications as are suited to the particular use contemplated.

I claim:

1. A method for calculating performance characteristics of a printed circuit board, comprising:
   modeling a printed circuit board;
   modeling a plurality of bypass components coupled to the printed circuit board, wherein a model of each of the plurality of bypass components includes a bypass capacitor in series with a bypass resistor;
   modeling a stimulus coupled to the printed circuit board;
   performing a simulation of a circuit model that includes the modeled printed circuit board and the modeled plurality of bypass components, wherein the simulation is responsive to the stimulus and is performed over a range of bypass resistor values; and
   determining a resistance value of each bypass resistor of the plurality of bypass components for which noise is reduced in the simulation of the circuit model.

2. The method of claim 1, wherein the model of each of the plurality of bypass components further includes a parallel capacitor coupled in parallel to the bypass capacitor in series with the bypass resistor.

3. The method of claim 2, wherein the simulation of the circuit model is performed over a range of parallel capacitor values.

4. The method of claim 1, wherein the simulation of the circuit model is performed over a range of bypass capacitor values.

5. The method of claim 1, wherein the simulation of the circuit model is performed over a range of frequency values.

6. The method of claim 5, wherein the range of frequency values includes frequencies over 100 MHz.

7. The method of claim 1, wherein the modeling of the printed circuit board is frequency dependent.

8. The method of claim 1, wherein the determined resistance value is dependent on frequency.

9. The method of claim 1, wherein modeling the printed circuit board includes modeling a power plane.

10. The method of claim 9, wherein the power plane is represented as a plurality of interconnected transmission lines.

11. The method of claim 10, wherein the transmission lines are ordered in a mesh.

12. The method of claim 11, wherein the bypass components are superimposed on the mesh.

13. The method of claim 1, wherein modeling the printed circuit board includes modeling a power supply coupled to the printed circuit board.

14. The method of claim 1, wherein modeling the printed circuit board includes modeling integrated circuits coupled to the printed circuit board.

15. The method of claim 1, wherein modeling the printed circuit board includes modeling discrete components coupled to the printed circuit board.

16. The method of claim 1, wherein the simulation yields voltages at points within the printed circuit board.

17. The method of claim 1, wherein the stimulus is a voltage stimulus.

18. The method of claim 1, wherein the stimulus is a current stimulus.

19. The method of claim 1, wherein the stimulus is time-varying.

20. The method of claim 1, wherein the simulation yields time varying results.

21. The method of claim 1, wherein the simulation yields a root mean squared (RMS) voltage.

22. The method of claim 21, wherein determining the resistance value for each bypass resistor of the plurality of bypass components reduces the RMS voltage below a pre-determined level.

23. The method of claim 21, wherein determining the resistance value for each bypass resistor of the plurality of bypass components reduces the RMS voltage to a minimum value.

24. The method of claim 21, further comprising: determining a capacitance value for each bypass capacitor of the plurality of bypass components that reduces RMS voltage below a predetermined level.

25. The method of claim 1, further including a step of determining a capacitor value that reduces RMS voltage to a minimum value.

26. The method of claim 1, wherein performing the simulation further includes
   generating an admittance matrix of the circuit model,
      inverting the admittance matrix of the circuit model, and
   calculating a response.

27. The method of claim 26, wherein the response is a voltage.

28. The method of claim 26, wherein the response is an RMS voltage.

29. The method of claim 26, wherein the response is a current.

30. The method of claim 26, wherein the response is an RMS current.

31. A printed circuit board, comprising:
   a power/ground plane pair;
   a plurality of bypass components coupled to the power/ground plane pair, each bypass component including a bypass capacitor coupled in series with a bypass resistor; and
   wherein each bypass resistor has a value selected to reduce noise responsive to a stimulus on the printed circuit board by modeling the power/ground plane pair as a circuit mesh of transmission lines coupled to the plurality of bypass components.

32. The printed circuit board of claim 31, wherein each bypass component further includes a parallel capacitor coupled in parallel to the bypass capacitor in series with the bypass resistor.

33. The printed circuit board of claim 32, wherein the parallel capacitor is selected to have a capacitance value that reduces the noise below a predetermined value.

34. The printed circuit board of claim 31, wherein the bypass resistor is selected to have a resistance value that reduces the noise below a predetermined value.

35. The printed circuit board of claim 34, wherein the resistance value is dependent on frequency.

36. The printed circuit board of claim 31, wherein bypass resistor is selected to have a resistance value that minimizes the noise.

37. The printed circuit board of claim 31, wherein the stimulus is applied by a power source.

38. The printed circuit board of claim 31, wherein each of the plurality of bypass components includes the capacitor as a first discrete package and the bypass resistor as a second discrete package.

39. The printed circuit board of claim 31, wherein each of the plurality of bypass components is a discrete package containing within it the bypass capacitor coupled in series with the bypass resistor.

40. The printed circuit board of claim 31, wherein a plurality of electrical components are coupled to the printed circuit board.

41. The printed circuit board of claim 40, wherein the plurality of electrical components are integrated circuits.

42. The printed circuit board of claim 40, wherein the plurality of electrical components are discrete components.

43. The printed circuit board of claim 40, wherein the plurality of electrical components are placed on the printed circuit board.

44. The printed circuit board of claim 31, wherein the noise has associated frequencies greater than approximately 100 MHz.

45. The printed circuit board of claim 31, wherein the bypass components are distributed across the printed circuit board.

46. The printed circuit board of claim 31, wherein each of the plurality of bypass components is contained within a single package.

47. A printed circuit board, comprising:
a power plane;
a plurality of bypass components coupled to the power plane, each bypass component including a bypass capacitor coupled in series with a bypass resistor;
wherein each bypass resistor is selected to reduce noise responsive to a stimulus on the printed circuit board; and
wherein each of the plurality of bypass components as a discrete package containing within it the bypass capacitor with a high equivalent series resistance (ESR), the high ESR being the bypass resistor.

48. The printed circuit board of claim 47, wherein the capacitor is nude from a high resistance conductor.

49. The printed circuit board of claim 47, wherein the capacitor is made using a lossy dielectric.

50. The printed circuit board claim 47, wherein the high ESR has a resistance value greater than 0.1 ohms.

51. A printed circuit board, comprising:
a power plane;
a plurality of bypass components coupled to the power plane, each bypass component including a bypass capacitor coupled in series with a bypass resistor;
wherein each bypass resistor is selected to reduce noise responsive to a stimulus on the printed circuit board; and wherein the power plane includes a positive power plane and a negative power plane.

52. A printed circuit board, comprising:
a power plane;
a plurality of bypass components coupled to the power plane, each bypass component including a bypass capacitor coupled in series with a bypass resistor;
wherein each bypass resistor is selected to reduce noise responsive to a stimulus on the printed circuit board; mid
wherein a density of bypass components exceeds one bypass component per square inch.

53. A computer-readable medium embodying program code for calculating characteristics of a printed circuit board having instructions that cause a computer to perform steps, comprising:
modeling a printed circuit board;
modeling a plurality of bypass components coupled to the printed circuit board, wherein a model of each of the plurality of bypass components includes a bypass capacitor in series with a bypass resistor;
modeling a stimulus coupled to the printed circuit board;
performing a simulation of a circuit model that includes the modeled primed circuit board and the modeled plurality of bypass components, wherein the simulation is responsive to the stimulus and is performed over a range of bypass resistor values; and
determining a resistance value of each bypass resistor of the plurality of bypass components for which noise is reduced in the simulation of the circuit model.

54. The computer-readable medium of claim 53, wherein the model of each of the plurality of bypass components further includes a parallel capacitor coupled in parallel to the bypass capacitor in series with the bypass resistor.

55. The computer-readable medium of claim 54, wherein the simulation of the circuit model is performed over a range of parallel capacitor values.

56. The computer-readable medium of claim 53, wherein the circuit simulation is performed over a range of bypass capacitor values.

57. The computer-readable medium of claim 53, wherein the circuit stimulation is performed over a range of frequency values.

58. The computer-readable medium of claim 53, wherein modeling the printed circuit board includes modeling a power plane.

59. The computer-readable medium of claim 58, wherein the power plane is represented as a plurality of transmission lines.

60. The computer-readable medium of claim 53, wherein modeling the printed circuit board includes modeling integrated circuits coupled to the printed circuit board.

61. The computer-readable medium of claim 53, wherein modeling the printed circuit board includes modeling discrete components coupled to the printed circuit board.

62. The computer-readable medium of claim 53, wherein the stimulus is a voltage stimulus.

63. The computer-readable medium of claim 53, wherein the stimulus is a current stimulus.

64. The computer-readable medium of claim 53, wherein the simulation yields RMS voltage.

65. The computer-readable medium of claim 64, further including a step of determining a resistor value that reduces RMS voltage below a predetermined level.

66. The computer-readable medium of claim 64, further including a step of determining a resistor value that reduces RMS voltage to a minimum value.

67. The computer-readable medium of claim 53, wherein the determined resistance value is dependent on frequency.

68. The computer-readable medium of claim 53, wherein performing the simulation further includes generating an admittance matrix of the circuit model;

inverting the admittance matrix of the circuit model; and calculating a response.

69. The computer-readable medium of claim 68, wherein the response is a voltage.

70. The computer-readable medium of claim 68, wherein the response is an RMS voltage.

71. A computer system for calculating performance characteristics of a printed Circuit board, comprising:

a memory for storage of information;

a processor coupled to the memory for execution of steps including modeling a printed circuit board;

modeling a plurality of bypass components coupled to the printed circuit board, wherein a model of each of the plurality of bypass components includes a bypass capacitor in series with a bypass resistor.

modeling a stimulus coupled to the printed circuit board;

performing a simulation of a circuit model that includes the modeled printed circuit board and the modeled plurality of bypass components, wherein the simulation is responsive to the stimulus and is performed over a range of bypass resistor values; and determining a resistance value of each bypass resistor of the plurality of bypass components for which noise is reduced in the simulation of the circuit model, an output device coupled to the processor for displaying results of the simulation.

72. The computer system of claim 71, wherein the model of each of the plurality of bypass components further includes a parallel capacitor coupled in parallel to the bypass capacitor in series with the bypass resistor.

73. The computer system of claim 72, wherein the simulation of the circuit model is performed over a range of parallel capacitor values.

74. The computer system of claim 71, wherein the circuit simulation is performed over a range of bypass capacitor values.

75. The computer system of claim 71, wherein the determined resistance value is dependent on frequency.

76. The computer system of claim 73, wherein the circuit simulation is performed over a range of frequency values.

77. The computer system of claim 76, wherein the range of frequency values includes frequencies over 100 MHz.

78. The computer system of claim 71, wherein the modeling of the printed circuit board is frequency dependent.

79. The computer system of claim 71, wherein modeling the printed circuit board includes modeling a power plane.

80. The computer system of claim 79, wherein the power plane is represented as a plurality of interconnected transmission lines.

81. The computer system of claim 71, wherein modeling the printed circuit board includes modeling integrated circuits coupled to the printed circuit board.

82. The computer system of claim 71, wherein modeling the printed circuit board includes modeling discrete components coupled to the printed circuit board.

83. The computer system of claim 71, wherein the stimulus is a voltage stimulus.

84. The computer system of claim 71, wherein the stimulus is a current stimulus.

85. The computer system of claim 71, wherein the simulation yields an RMS voltage.

86. The computer system of claim 85, further including a step of determining a resistor value that reduces RMS voltage below a predetermined level.

87. The computer system of claim 85, further including a step of determining a resistor value that reduces RMS voltage to a minimum value.

88. The computer system of claim 71, wherein performing the simulation further includes generating admittance matrix of the circuit model;

inverting the admittance matrix of the circuit model; and calculating a response.

89. The computer system of claim 88, wherein the response is a voltage.

90. The computer system of claim 88, wherein the response is an RMS voltage.

91. A method for reducing noise in a printed Circuit board, the printed circuit board having a power plane and a ground plane, comprising:

coupling a stimulus to the power plane and the ground plane;

coupling a plurality of bypass components to the power plane and the ground plane, each bypass component including a bypass capacitor coupled in series with a bypass resistor;

measuring a noise value of the printed circuit board responsive to the stimulus; and determining a resistance value for each bypass resistor of the plurality of bypass components that reduces the noise value of the printed circuit board.

92. The method of claim 91, wherein each bypass component further includes a parallel capacitor coupled in parallel to the bypass capacitor in series with the bypass resistor.

93. The method of claim 92, further comprising:

determining a parallel capacitor value for each parallel capacitor of the plurality of bypass components that reduces noise in the simulation of the circuit model.

94. The method of claim 91, further comprising:

determining a capacitance value for each bypass capacitor of the plurality of bypass components that reduces noise in the simulation of the circuit model.

95. The method of claim 91, wherein the noise value represents noise over a range of frequency values.

96. The method of claim 91, wherein the noise value represents noise of frequencies over 100 MHz.

97. The method of claim 91, further comprising:

coupling a power supply to the power plane and the ground plane.

98. The method of claim 91, further comprising:

coupling integrated circuits to the power plane and the ground plane.

99. The method of claim 91, further comprising:

coupling discrete components to the power plane and the ground plane.

100. The method of claim 91, wherein noise value is measured at points within the printed circuit board.

101. The method of claim 91, wherein the stimulus is a voltage stimulus.

102. The method of claim 91, wherein the stimulus is a current stimulus.

103. The method of claim 91, wherein the determined resistance value is dependent on frequency.

104. The method of claim 91, wherein the noise value is measured as a root mean square (RMS) voltage.

105. The method of claim 104, wherein determining the resistance value for each bypass resistor of the plurality of bypass components reduces the RMS voltage below a predetermined level.

106. The method of claim 104, wherein determining the resistance value for each bypass resistor of the plurality of bypass components reduces the RMS voltage to a minimum value.

* * * * *

UNITED STATES PATENT AND TRADEMARK OFFICE
CERTIFICATE OF CORRECTION

PATENT NO. : 6,870,436 B2
APPLICATION NO. : 10/097215
DATED : March 11, 2002
INVENTOR(S) : John Grebenkemper It is certified that error appears in the above-identified patent and that said Letters Patent is hereby corrected as shown below:

IN THE CLAIMS

Claim 24, Column 18, line 33, after "comprising:" begin a new paragraph

Claim 25, Column 18, line 38, delete "claim 1" and insert therefor --claim 21--

Claim 26, Column 18, line 41, after "includes" insert --:--

Claim 47, Column 19, line 50, after "components" delete "as" and insert therefor --is--

Claim 48, Column 19, line 55, delete "nude" and insert therefor --made--

Claim 50, Column 19, line 58, after "circuitboard" insert --of--

Claim 52, Column 20, line 10, delete "mid" and insert therefor --and--

Claim 53, Column 20, line 24, delete "primed" and insert therefor --printed--

Claim 57, Column 20, line 42, delete "stimulation" and insert therefor --simulation--

Claim 68, Column 21, line 4, after "includes" insert --:--

Claim 71, Column 21, line 14, delete "Circuit" and insert therefor --circuit--

Claim 71, Column 21, line 22, after "resistor" delete "." and insert therefor --;--

Claim 76, Column 21, line 47, delete "claim 73" and insert therefor --claim 71--

UNITED STATES PATENT AND TRADEMARK OFFICE
CERTIFICATE OF CORRECTION

PATENT NO. : 6,870,436 B2
APPLICATION NO. : 10/097215
DATED : March 11, 2002
INVENTOR(S) : John Grebenkemper It is certified that error appears in the above-identified patent and that said Letters Patent is hereby corrected as shown below:

IN THE CLAIMS

Claim 88, Column 22, line 10, after "includes" insert --:--

Claim 88, Column 22, line 13, after "and" begin a new paragraph

Claim 91, Column 22, line 19, delete "Circuit" and insert therefor --circuit--

Claim 104, Column 23, line 2, delete "square" and insert therefor --squared--

Signed and Sealed this

Twenty-seventh Day of January, 2009

JOHN DOLL
*Acting Director of the United States Patent and Trademark Office*

UNITED STATES PATENT AND TRADEMARK OFFICE
CERTIFICATE OF CORRECTION

PATENT NO. : 6,870,436 B2
APPLICATION NO. : 10/097215
DATED : March 22, 2005
INVENTOR(S) : John Grebenkemper It is certified that error appears in the above-identified patent and that said Letters Patent is hereby corrected as shown below:

IN THE CLAIMS

Claim 24, Column 18, line 33, after "comprising:" begin a new paragraph

Claim 25, Column 18, line 38, delete "claim 1" and insert therefor --claim 21--

Claim 26, Column 18, line 41, after "includes" insert --:--

Claim 47, Column 19, line 50, after "components" delete "as" and insert therefor --is--

Claim 48, Column 19, line 55, delete "nude" and insert therefor --made--

Claim 50, Column 19, line 58, after "circuitboard" insert --of--

Claim 52, Column 20, line 10, delete "mid" and insert therefor --and--

Claim 53, Column 20, line 24, delete "primed" and insert therefor --printed--

Claim 57, Column 20, line 42, delete "stimulation" and insert therefor --simulation--

Claim 68, Column 21, line 4, after "includes" insert --:--

Claim 71, Column 21, line 14, delete "Circuit" and insert therefor --circuit--

Claim 71, Column 21, line 22, after "resistor" delete "." and insert therefor --;--

Claim 76, Column 21, line 47, delete "claim 73" and insert therefor --claim 71--

UNITED STATES PATENT AND TRADEMARK OFFICE
CERTIFICATE OF CORRECTION

PATENT NO. : 6,870,436 B2
APPLICATION NO. : 10/097215
DATED : March 22, 2005
INVENTOR(S) : John Grebenkemper It is certified that error appears in the above-identified patent and that said Letters Patent is hereby corrected as shown below:

IN THE CLAIMS

Claim 88, Column 22, line 10, after "includes" insert --:--

Claim 88, Column 22, line 13, after "and" begin a new paragraph

Claim 91, Column 22, line 19, delete "Circuit" and insert therefor --circuit--

Claim 104, Column 23, line 2, delete "square" and insert therefor --squared--

This certificate supersedes the Certificate of Correction issued January 27, 2009.

Signed and Sealed this

Seventeenth Day of February, 2009

JOHN DOLL
*Acting Director of the United States Patent and Trademark Office*

UNITED STATES PATENT AND TRADEMARK OFFICE
CERTIFICATE OF CORRECTION

PATENT NO. : 6,870,436 B2  
APPLICATION NO. : 10/097215  
DATED : March 22, 2005  
INVENTOR(S) : John Grebenkemper Page 1 of 1

It is certified that error appears in the above-identified patent and that said Letters Patent is hereby corrected as shown below:

Claim 48, Column 19, line 55, delete "nude" and insert therefor --made--

Claim 52, Column 20, line 10, delete "mid" and insert therefor --and--

Claim 53, Column 20, line 24, delete "primed" and insert therefor --printed--

Claim 71, Column 21, line 14, delete "Circuit" and insert therefor --circuit--

Claim 88, Column 22, line 12, after "generating" insert --an--

Signed and Sealed this

Third Day of November, 2009

David J. Kappos  
*Director of the United States Patent and Trademark Office*